US006801869B2

(12) United States Patent
McCord

(10) Patent No.: US 6,801,869 B2
(45) Date of Patent: Oct. 5, 2004

(54) METHOD AND SYSTEM FOR WAFER AND DEVICE-LEVEL TESTING OF AN INTEGRATED CIRCUIT

(76) Inventor: Don McCord, 4448 Eck La., Austin, TX (US) 78734

( * ) Notice: Subject to any disclaimer, the term of this patent is extended or adjusted under 35 U.S.C. 154(b) by 169 days.

(21) Appl. No.: 09/980,509

(22) PCT Filed: Feb. 21, 2001

(86) PCT No.: PCT/US01/05455

§ 371 (c)(1),
(2), (4) Date: Oct. 19, 2001

(87) PCT Pub. No.: WO01/63311

PCT Pub. Date: Aug. 30, 2001

(65) Prior Publication Data

US 2002/0173926 A1 Nov. 21, 2002

Related U.S. Application Data

(60) Provisional application No. 60/234,647, filed on Sep. 22, 2000, and provisional application No. 60/184,192, filed on Feb. 22, 2000.

(51) Int. Cl.[7] .......................... G06F 19/00; G11C 29/00
(52) U.S. Cl. ....................................... 702/117; 714/718
(58) Field of Search ................................ 702/112, 118, 702/120, 124; 714/29, 718, 738, 739; 365/200, 201, 219; 324/765, 764, 761, 605

(56) References Cited

U.S. PATENT DOCUMENTS 5,325,053 A 6/1994 Gasbarro et al.

(List continued on next page.)

FOREIGN PATENT DOCUMENTS

WO    WO 00/13186 A1    3/2000

(List continued on next page.)

OTHER PUBLICATIONS

Gasbarro, J.A.; Horowitz, M.A.; Rambus Inc.; *Techniques for Characterizing Drams with a 500 MHZ Interface*, Proceedings of the International Test Conference, US, New York, IEEE, Oct. 2, 1994, pp. 516–525.

(List continued on next page.)

*Primary Examiner*—Patrick J. Assouad
(74) *Attorney, Agent, or Firm*—Brian F. Russell; Dillon & Yudell LLP

(57) ABSTRACT

A tester comprises test logic and a connector for at least one device under test. The connector, which may comprise a wafer probe for dice on a wafer or a test fixture for packaged integrated circuit devices, has connections for the device under test that present an impedance selected to emulate the characteristic impedance of an end-use environment of the device under test. For example, in an embodiment in which the device under test comprises a logic device using Rambus Signaling Levels (RSL) to communicate to other devices and the end-use environment is connection to a Rambus channel, the characteristic impedance is between approximately 20 and 60 ohms. If, on the other hand, the end-use environment is connection to a Rambus memory module, then the characteristic impedance is approximately 28 ohms. Alternatively, if the end-use environment is connection to a DDR memory module, then the characteristic impedance is approximately 60 ohms. Thus, the tester of the present invention can accurately simulate operational behavior in an end-use environment of the device under test. Because this accurate simulation is available even for dice on a wafer, the needless expense associated with packaging defective dies and assembling defective dies into boards can be avoided. The test logic, which is coupled to the connector for communication with the deviceunder test, transfers test vectors and test data to the device under test. The test data and commands are utilized to perform multiples types of tests, including tests of the core logic and interface logic of the device under test. In this manner, the need for multiple types of testers is reduced or eliminated.

74 Claims, 26 Drawing Sheets

U.S. PATENT DOCUMENTS

| | | | | |
|---|---|---|---|---|
| 5,748,006 A | * | 5/1998 | Sano | 324/754 |
| 6,019,639 A | * | 2/2000 | Brunker et al. | 439/637 |
| 6,218,910 B1 | * | 4/2001 | Miller | 333/33 |
| 6,236,572 B1 | * | 5/2001 | Teshome et al. | 361/794 |
| 6,501,343 B2 | * | 12/2002 | Miller | 333/33 |
| 6,587,896 B1 | * | 7/2003 | Baldwin et al. | 710/13 |
| 6,622,103 B1 | * | 9/2003 | Miller | 702/89 |
| 2001/0034865 A1 | * | 10/2001 | Park et al. | 714/724 |
| 2002/0074653 A1 | * | 6/2002 | Khandros et al. | 257/724 |
| 2002/0175697 A1 | * | 11/2002 | Miller et al. | 324/765 |
| 2003/0006856 A1 | * | 1/2003 | Miller | 333/32 |
| 2003/0076125 A1 | * | 4/2003 | McCord | 324/765 |

FOREIGN PATENT DOCUMENTS

| | | |
|---|---|---|
| WO | WO 01/35110 A1 | 5/2001 |
| WO | WO 01/63311 A3 | 8/2001 |
| WO | WO 01/63311 A2 | 8/2001 |

OTHER PUBLICATIONS

Goldberg, J.M.; *Timing: The Key to Rambus Testing*, Test and Measurement World, US, Cahners Publishing, Denver, vol. 17, No. 11, Oct. 1, 1997, pp. 53–54, 56, 58–29.

Ho, C.C.; *Defining Tomorrow's Memory Module Tester*, E E: Evaluation Engineering, vol. 38, No. 3, Mar. 1999, pp. 14–18.

Pointl, Peter; *Interfacing, Often a Performance Bottleneck Between ATE and Device Under Test*; Computer Society Press, 1st European Test Conference, Apr. 1989, pp. 94–99.

Pointl, Peter; *Interfacing, Often a Performance Bottleneck Between Ate and Device Under Test*, Computer Society Press, 1st European Test Conference, Apr. 1989, pp. 94–99.

* cited by examiner

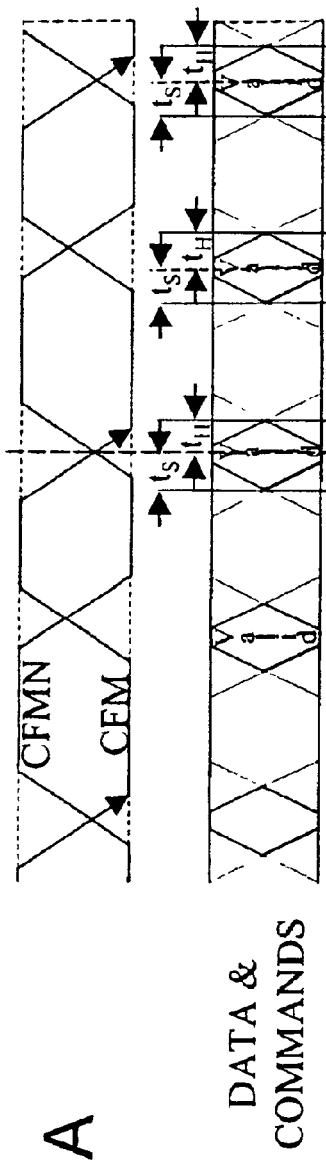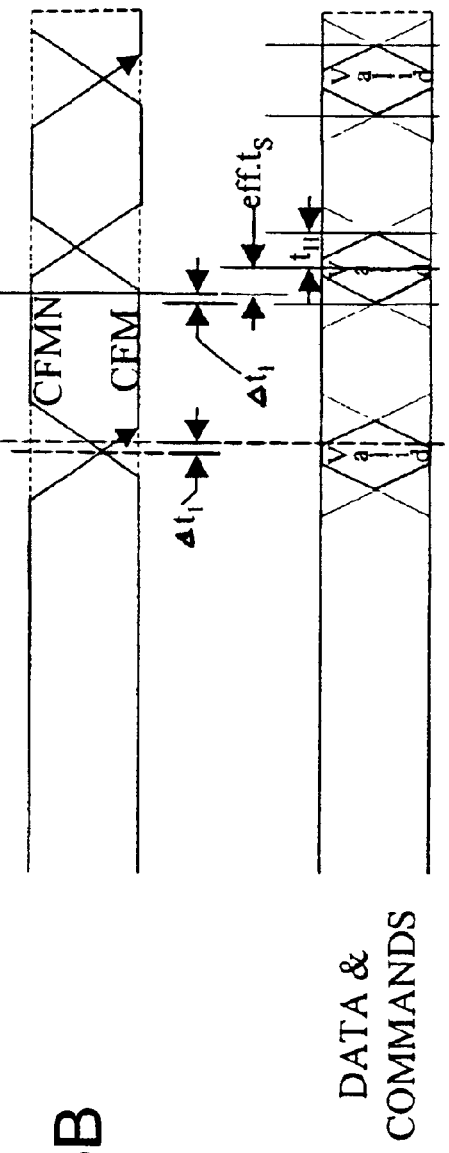
Figure 5A
Figure 5B

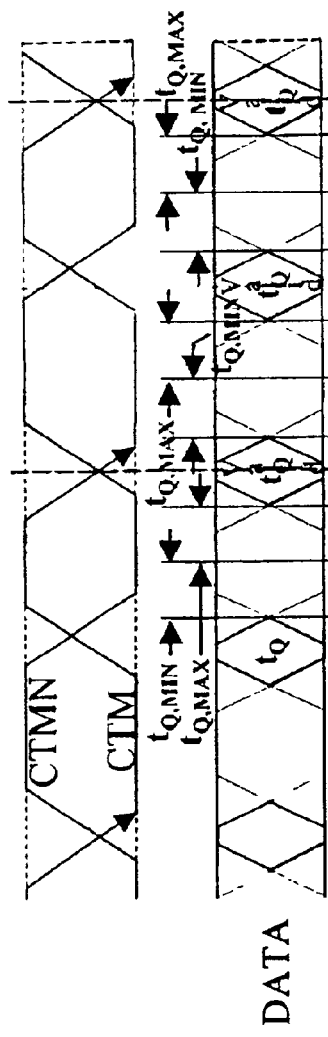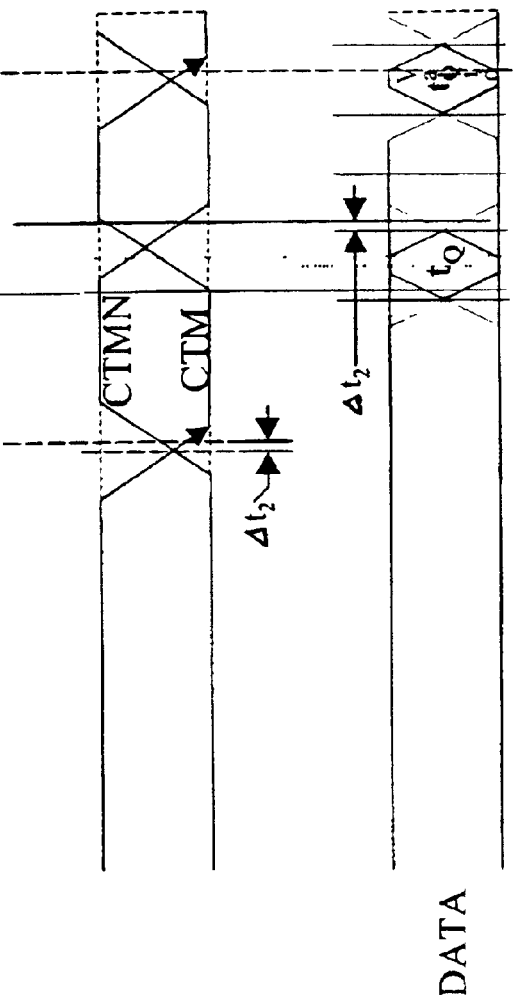
Figure 6A
Figure 6B

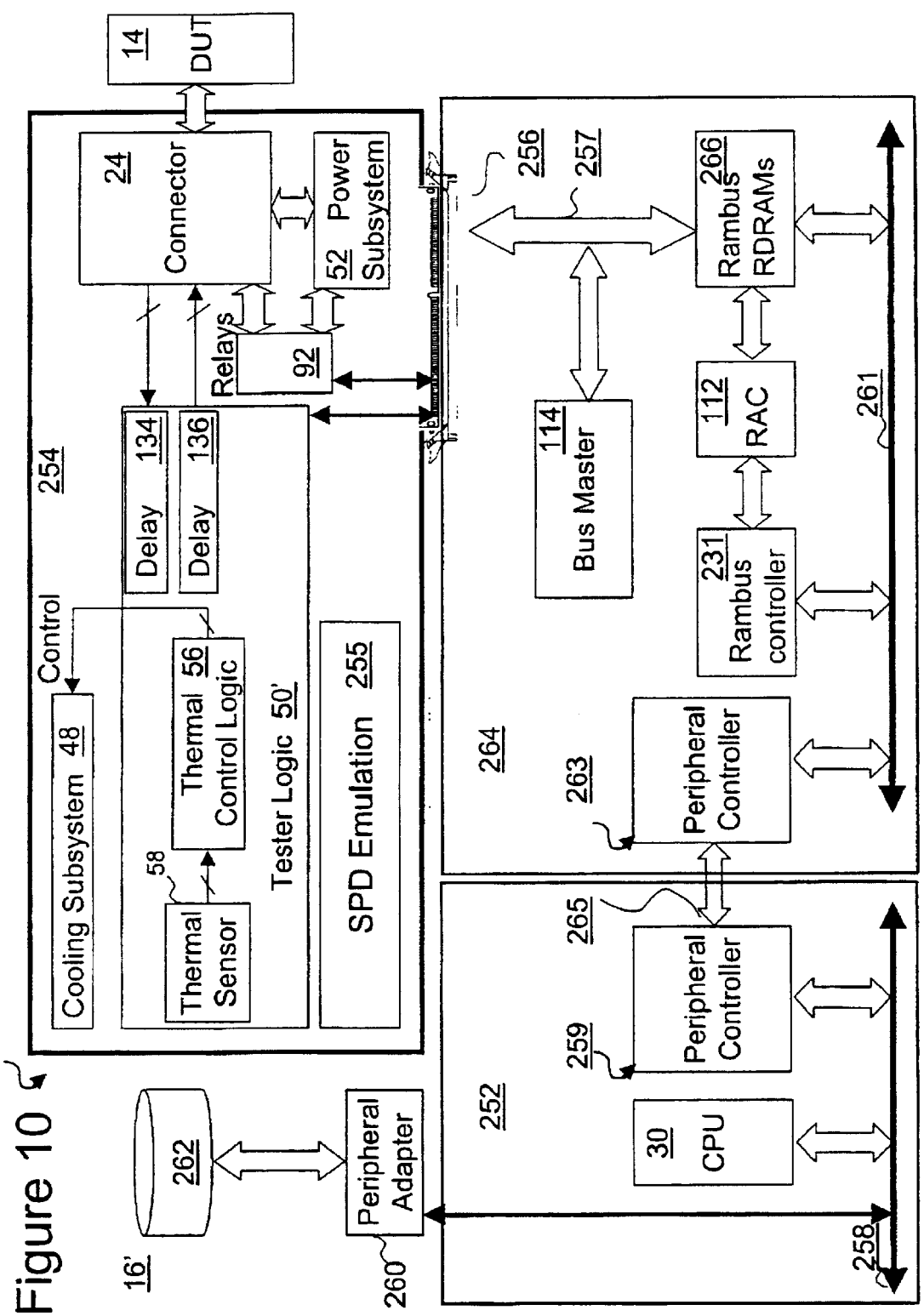

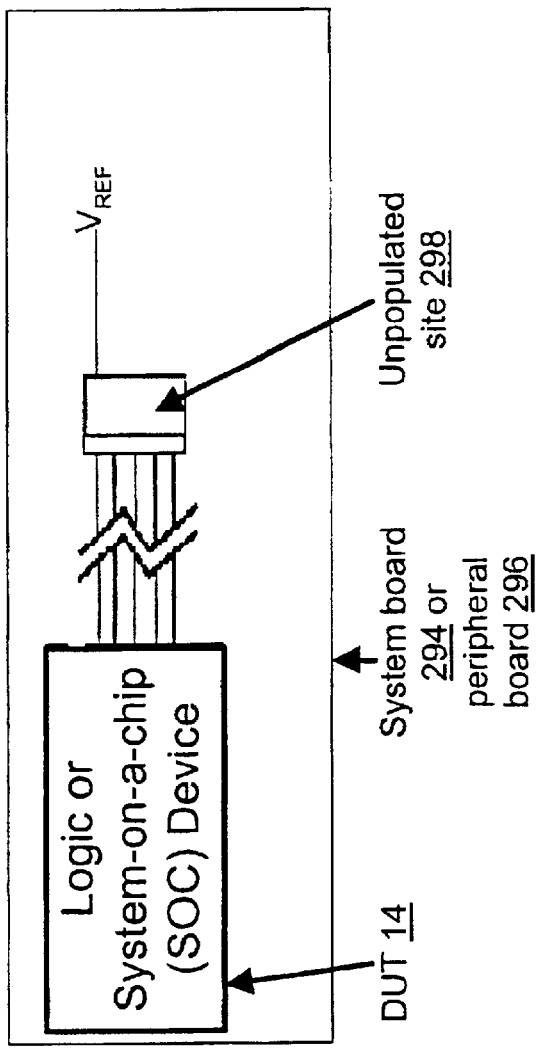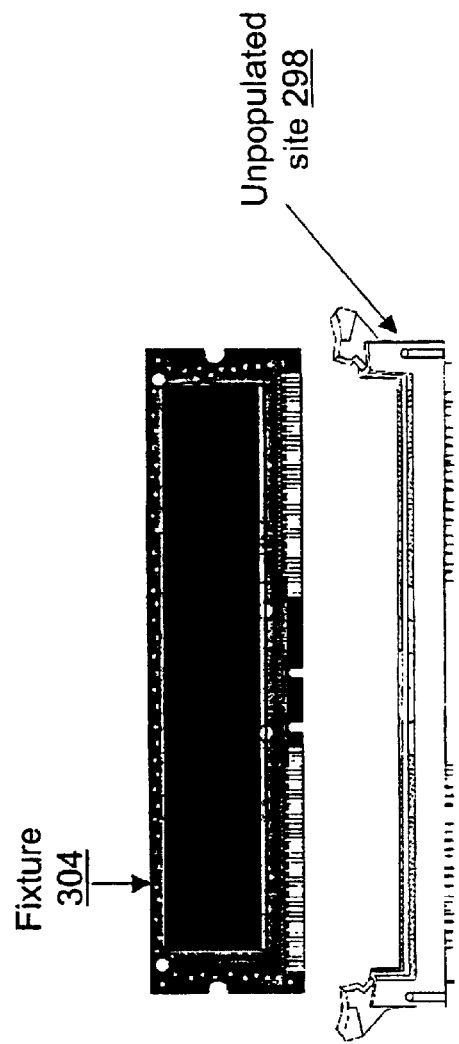
Figure 20A
Figure 20B

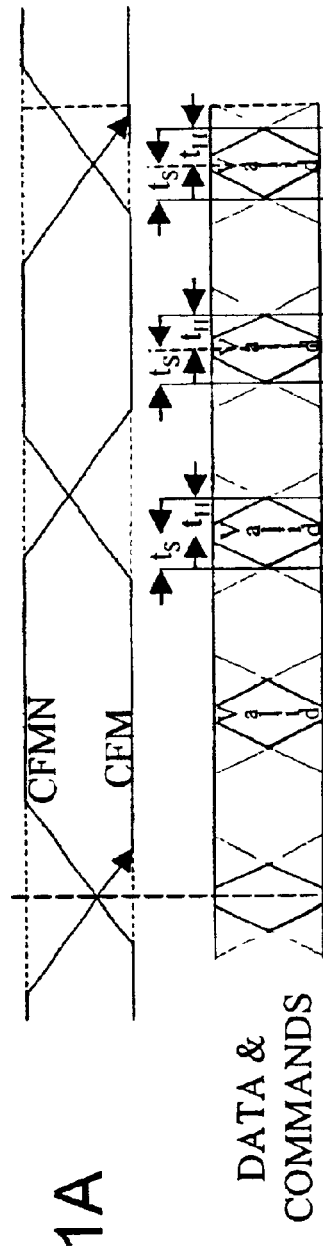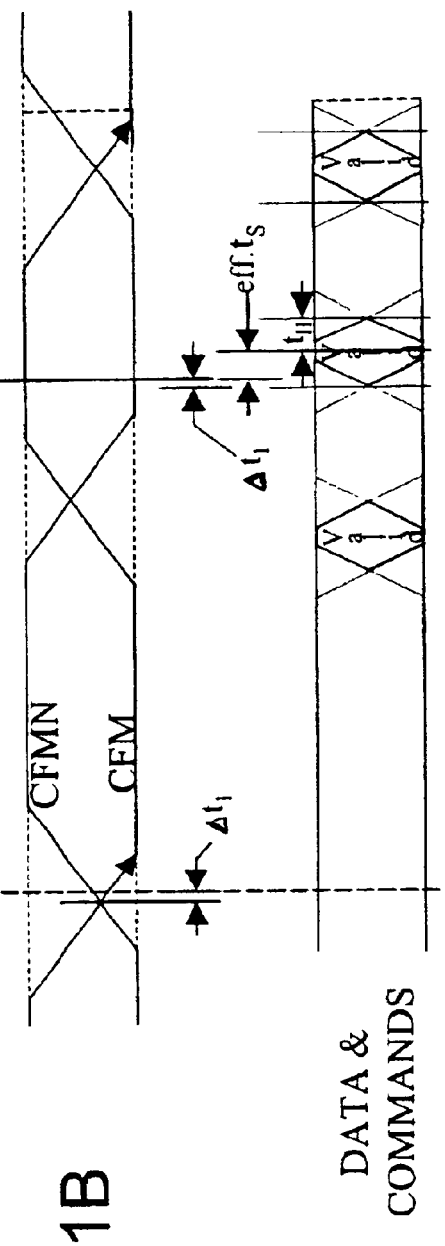
Figure 21A
Figure 21B

METHOD AND SYSTEM FOR WAFER AND DEVICE-LEVEL TESTING OF AN INTEGRATED CIRCUIT

This national stage application claims the benefit of:

U.S. Provisional Application No. 60/184,192, filed on Feb. 22, 2000, and entitled "*Method and Apparatus for Wafer and Device Level Testing for an RSL Logic Device,*" and U.S. Provisional Application No. 60/234,647, filed on Sep. 22, 2000, and entitled "*Memory Tester Architecture.*"

BACKGROUND OF THE INVENTION

1. Technical Field

The present invention relates in general to testing electronic devices and, in particular, to testing integrated circuits. Still more particularly, the present invention relates to a method and system for wafer and device-level testing of integrated circuits such as logic devices.

2. Description of the Related Art

Integrated electronic circuits, such as logic devices, are often designed to use external devices, such as dynamic random access memories (DRAMs), to provide data storage in electronic systems, such as computer systems. To ensure proper operation of the electronic systems, the manufacturing process for integrated circuit logic devices includes a number of testing steps intended to verify that the logic devices will provide reliable performance over the expected lifetime of the electronic systems in which they are installed.

A typical manufacturing process for logic devices begins with the fabrication of a semiconductor wafer containing hundreds or even thousands of identical dice. The circuitry in each logic device using external DRAM generally includes integrated DRAM interface circuits for storing data into and retrieving data from the DRAM's memory array and performing other operations in response to memory requests or commands.

Following wafer fabrication, a quick wafer probe is performed in an attempt to identify dies on the wafer having defects. The wafer probe often tests only a small portion of the circuits in the DRAM interface utilizing clock rates that are lower than normal operating frequencies.

Following the wafer probe, the wafer is scribed into dice. Dice marked as faulty after the wafer probes are discarded, and dice passing the wafer probe are packaged to obtain logic devices. Packaging technologies that are commonly used for logic devices include, among others, ball grid array (BGA) and wire bond.

After packaging, the logic devices are subjected to device-level testing. Device-level testing, like the wafer probe tests, may include low frequency tests of the DRAM interface circuits. Device-level testing may also include a "burn-in" test in which the packaged logic devices under test are subjected to high ambient temperatures and tests of long duration in order to discover early life failures. Device-level testing also differs is from wafer probe testing in that, in addition to basic pattern testing of the DRAM interface circuits, device-level testing generally tests the DC and AC characteristics of the logic and operation of the memory interface. Device-level testing also differs from wafer probe testing in that device-level testing is typically performed at or near the rated signal frequencies of the external DRAM, and these frequencies often require more sophisticated and expensive test equipment.

Logic devices with DRAM interface circuitry that pass the device-level test may subsequently be assembled onto circuit cards to form logic boards such as computer main boards and Peripheral Component Interconnect (PCI) expansion boards. Each logic board is then typically subjected to a final, intensive fault test prior to shipping or installation. The faults detected by board testing include faults in the circuit cards themselves (e.g., open or shorted traces), faults introduced by board assembly (e.g., damaged pin drivers, open or shorted pins, and ESD damage), and undetected faults in the logic device circuitry. Following completion of testing, logic devices and boards that pass can then be installed in an end-use application.

One drawback of the conventional logic device manufacturing process outlined above is that a number of faults are not discovered until late in the manufacturing process, for example, during device-level and board testing. As appreciated by the present invention, if such defects could be detected earlier in the manufacturing process (i.e., during wafer testing), the significant expense associated with packaging and board assembly of the defective dice could be eliminated. Unfortunately, the expense of the sophisticated test equipment currently required to fully exercise integrated DRAM interface circuitry prohibits its use during wafer testing.

A second drawback of the conventional manufacturing process is that several different pieces of specialized test equipment are required to fully test many integrated circuit logic devices. For example, to test the DRAM interface of a logic device, an algorithmic tester is utilized to stress the AC timing of a predetermined parameter for memory accesses. A separate vector tester is utilized to exercise the built-in self-test (BIST) functions of the logic device. A third system tester is often employed to verify proper operation of external DRAM in response to commands. As will be appreciated, the use of multiple testers compounds the expense of testing.

A third drawback of the prior art is that conventional test equipment does not fully emulate the intended end-use environment of devices under test. In particular, conventional testers for packaged logic devices and boards have a fixed input impedance. This input impedance cannot be adjusted and may result in test behavior that is quite different from the operating behavior of the logic with DRAM interface device under test when it is eventually installed in an end-use environment. Consequently, there may be an unacceptably high number of faulty devices or boards that pass the test process and even some satisfactory devices that fail the test process.

SUMMARY OF THE INVENTION

The present invention overcomes the foregoing and additional shortcomings in the prior art by introducing an improved method and system for wafer and device-level testing of integrated circuits such as logic devices with DRAM interface circuits.

According to a preferred embodiment of the present invention, a tester comprises test logic and a connector for at least one device under test. The connector, which may comprise a wafer probe for dice on a wafer or a test fixture for packaged integrated circuit devices, has connections for the device under test that present an impedance selected to emulate the characteristic impedance of an end-use environment of the device under test. For example, in an embodiment in which the device under test comprises logic devices using Rambus™ Signal Levels to interface to memory and the end-use environment is a Rambus™ channel connecting to Rambus DRAMs (RDRAMs), the characteristic impedance is between approximately 20 and 60 ohms. If, on the other hand, the end-use environment is connection to a socket for Rambus™ memory modules, then the characteristic impedance is approximately 28 ohms. Alternatively, if the end-use environment is connection to a socket for double data rate (DDR) memory modules, then the characteristic impedance is approximately 60 ohms. Thus, the tester of the present invention can accurately simulate operational behavior in an end-use environment of the device under test. Because this accurate simulation is available even for dice on a wafer, the needless expense associated with packaging defective dice and assembling defective dice onto boards can be avoided.

The test logic, which is coupled to the connector for communication with the device under test, transfers test commands and test data to the device under test. The test data and commands are utilized to perform multiples types of tests, including tests of the core logic and interface logic of the device under test. In this manner, the need for multiple types of testers is reduced or eliminated.

Additional objects, features, and advantages of the present invention will become apparent from the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 5A is a timing diagram illustrating the timing of the clock from master (CFM) and clock from master negative (CFMN) signals provided by the Rambus™ memory controller in the logic device under test in relation to the setup and hold times of WRITE operations;

FIG. 5B is a timing diagram depicting the use of a programmable delay in the clock-from-master (CFM) and clock-from-master negative (CFMN) signals provided by the Rambus™ memory controller in the logic device under test to test the timing sensitivity of WRITE operations;

FIG. 6A is a timing diagram illustrating the timing of the clock-to-master (CTM) and clock-to-master negative (CTMN) signals provided to the Rambus™ memory controller in the logic device under test in relation to valid times for READ transactions;

FIG. 6B is a timing diagram depicting the use of a programmable delay in the clock-to-master (CTM) and clock-to-master negative (CTMN) signals provided to the Rambus™ memory controller in the logic device under test to test the timing sensitivity of READ operations;

FIG. 10 illustrates a fourth alternative embodiment of a logic tester in accordance with the present invention for testing DUTs having Rambus™ memory controllers;

FIGS. 20A–20B illustrate a second fixture embodiment for a logic tester for testing DUTs having DDR memory controllers, wherein the DUTs are manufactured onto circuit boards;

FIG. 21A is a timing diagram illustrating the timing of the clock-from-master (CFM) and clock-from-master negative (CFMN) signals for logic devices performing WRITE operations using a derivative of Rambus Signaling Levels with more than 2 transfers per clock, such as QSL;

FIG. 21B is a timing diagram depicting the use of a programmable delay in the timing of the clock-from-master (CFM) and clock-from-master negative (CFMN) signals for logic devices performing WRITE operations using a derivative of Rambus Signaling Levels with more than 2 transfers per clock, such as QSL;

DETAILED DESCRIPTION OF A PREFERRED EMBODIMENT

Figure 1:
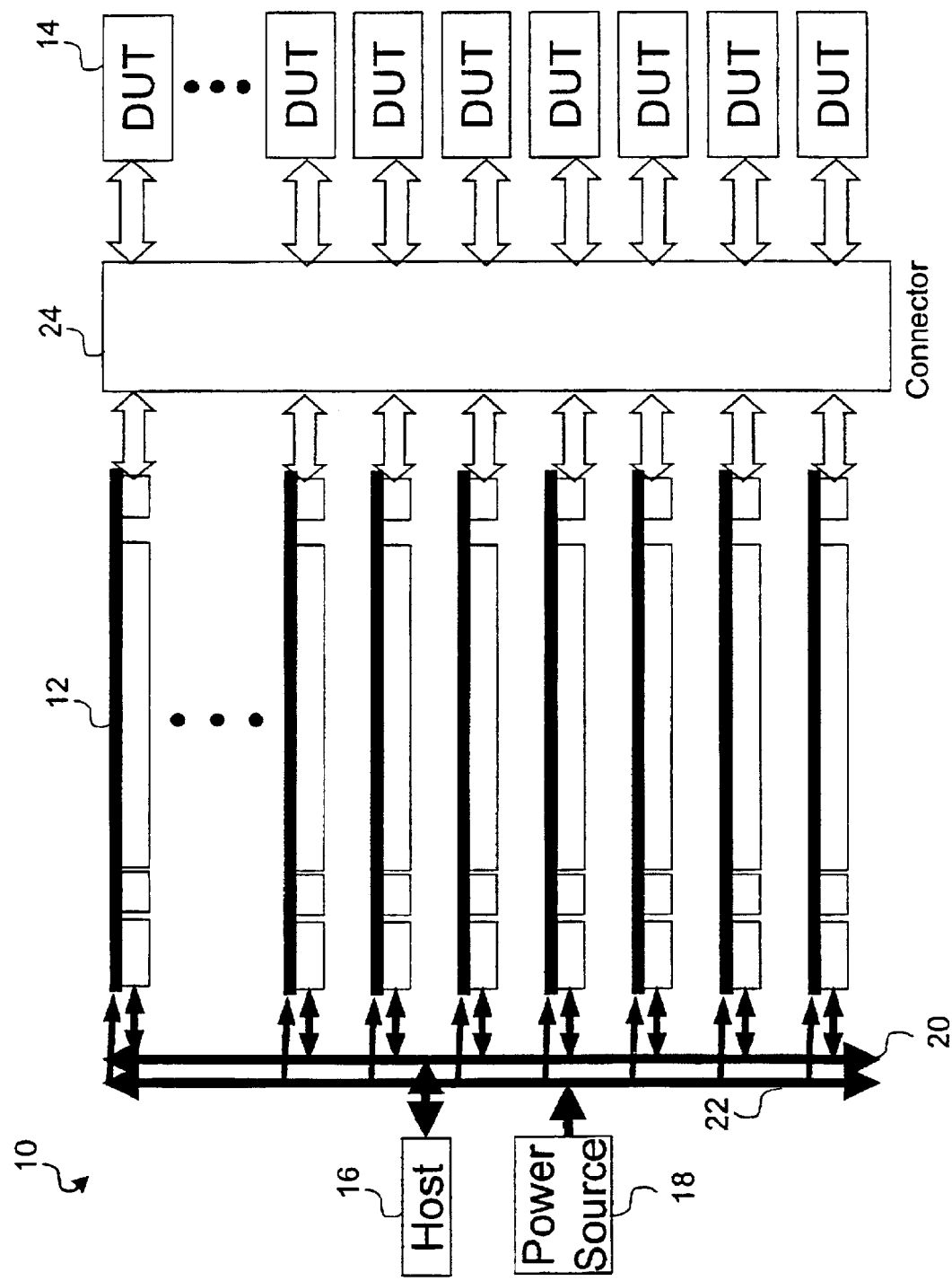
FIG. 1 is a high-level block diagram of a logic tester in accordance with a preferred embodiment of the present invention.

With reference now to the figures and in particular with reference to FIG. 1, there is depicted a high-level block diagram of an illustrative embodiment of a logic tester in accordance with the present invention. As illustrated, logic tester 10 includes one or more (e.g., 64) tester logic boards 12 that each includes circuitry for testing one device under test 14. In the context of the present invention, a "device under test" (DUT) is defined as either a die on a semiconductor wafer or a packaged integrated circuit device. Each tester logic board 12 is coupled to a host 16 and a power source 18 (e.g., 110 V AC) via a communication bus 20 and a power bus 22, respectively. Host 16, which may be a suitably programmed personal computer or a control processor, downloads test procedures and test parameters to and receives test results from tester logic boards 12 via communication bus 20.

As further illustrated in FIG. 1, each tester logic board 12 is coupled to a is respective DUT 14 by a controlled impedance connector 24 having connection elements suitable for the type of DUT 14 being tested. Thus, if DUTs 14 are logic dice on a wafer, connector 24 comprises a wafer probe; if, however, DUTs 14 are packaged logic devices, connector 24 comprises a test fixture having sites for connecting to packaged logic devices. For flexibility, tester logic boards 12 preferably employ a "universal" interface that can support both types of connectors 24. Importantly, and as discussed further below, the connection elements of connector 24 present to each DUT 14 a characteristic impedance that is selected to simulate an end-use environment of DUTs 14.

Figure 2:
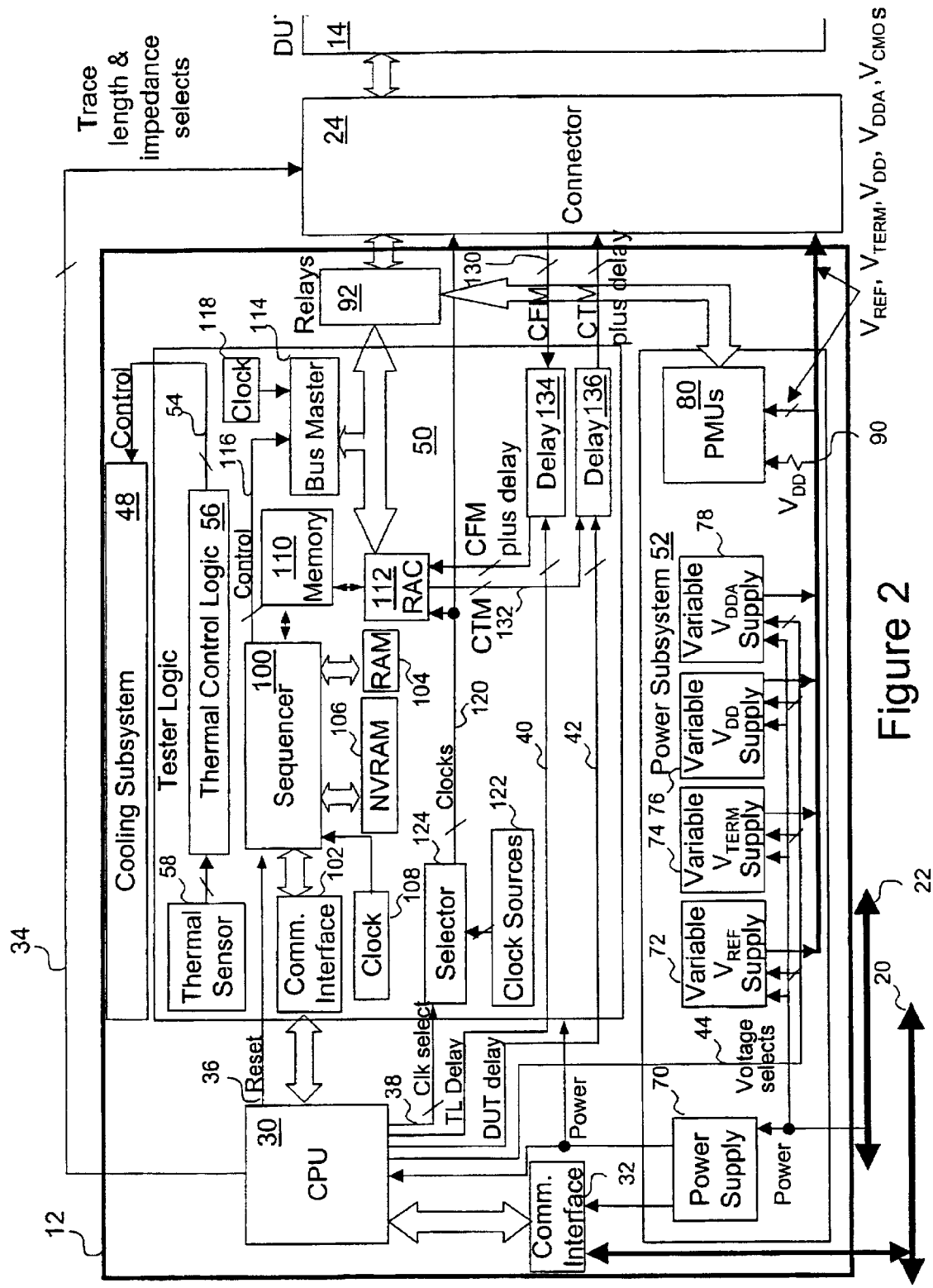
FIG. 2 is a more detailed block diagram of a first tester logic card in the logic tester illustrated in FIG. 1, wherein the first test logic card includes tester logic for testing a device under test (DUT) having a Rambus™ memory controller.

Referring now to FIG. 2, there is illustrated a more detailed block diagram of a first tester logic board 12 from FIG. 1 in accordance with a preferred embodiment of the present invention. The depicted embodiment includes circuitry specifically designed for testing logic DUTs having integrated Rambus™ dynamic random access memory (RDRAM) memory control circuitry; however, those skilled in the art will appreciate that the present invention is not limited to testing logic DUTs with RDRAM memory controllers, but is instead applicable to testing other types of integrated circuitry. References useful for an understanding of the depicted embodiment of the present invention include the following Rambus™ documentation (which is incorporated herein by reference):

a) *Direct Rambus™ System and Board Design Considerations*, Rambus, Inc., May 1998;

b) *RIMM Module Specification*, ver. 1.00, Rambus, Inc.;

c) *128/144-Mbit Direct RDRAM Data Sheet*, Rev. 1.11, Rambus, Inc., June 2000;

d) *RIMM Module Design Guide, ver.* 0.90, Rambus, Inc.;

e) *Rambus RIMM Module* (with 128/144-*Mbit RDRAMs*), Rev. 1.2, Rambus, Inc., October 2000;

f) *Direct Rambus™ RAC*, rev. 1.11, Rambus, Inc., Jul. 24, 2000; and g) *Direct Rambus™ Clock Generator Data Sheet*, Rev. 1.1, Rambus, Inc., June 2000.

As shown, each tester logic board 12 includes a state machine or central processing unit (CPU) 30 that controls the testing performed by that tester logic board 12. CPU 30 receives test procedures, test parameters, test data and expected test results from host 16 via communication bus 20 and communication interface 32. Based upon these inputs, CPU 30 generates a number of output signals 34–44 (described further below) to orchestrate the operation of the other components of tester logic board 12 during testing.

In addition to CPU 30, tester logic board 12 includes at least three principal subsystems: cooling subsystem 48, tester logic 50 and power subsystem 52. Cooling subsystem 48, which may comprise, for example, a convection or thermoelectric cooling system, dissipates heat produced by the components of tester logic board 12. The operation of cooling subsystem 48 is actively controlled by cooling control signals generated by thermal control logic 56 within tester logic 50 in response to the output of a thermal sensor 58.

Power subsystem 52 includes a power supply 70 that utilizes power received from power bus 22 to provide power with the appropriate voltage and current characteristics to CPU 30 and tester logic 50. Power subsystem 52 further includes a number of variable voltage supplies 72–78 that provide voltages utilized to operate DUT 14. In the illustrated embodiment, in which tester logic board 12 is designed to test logic DUTs having Rambus™ memory controller circuits, variable power supplies 72–78 include variable reference voltage ($V_{REF}$) supply 72, variable termination voltage ($V_{TERM}$) supply 74, variable $V_{DD}$ supply 76 and variable $V_{DDA}$ supply 78. Each of variable voltage sources 72–78 outputs a respective selected voltage specified by voltage select signals 44 provided by CPU 30.

Power subsystem 52 finally includes at number of power measurement unit (PMUs) 80, which are selectively coupled to the output pins of DUT 14 by relays 92. Relays 92 can be configured by CPU 30 to route signals present at the output pins of DUT 14 either to tester logic 50 for evaluation of the correctness of their logic states and/or timing or to PMUs 80 for measurement of their DC power characteristics. As described further below, at least one of PMUs 80 measures the source voltage(s) and current supplied to DUT 14 by determining the voltage drop across a test resistor 90. Other PMUs 80 preferably measure the leakage current of the pins of DUT 14.

In addition to the thermal sensor 58 and thermal control logic 56 discussed above, tester logic 50 includes a sequencer 100, which may comprise, for example, a general-purpose processor, a plurality of bit-slice (e.g., 4-bit) processors working in concert, a state machine, or an application-specific integrated circuit (ASIC). Sequencer 100 is coupled to CPU 30 by a communication interface 102 through which sequencer 100 receives test parameters, test data, correct test results, and test procedures, which are stored by sequencer 100 in random access memory (RAM) 104. Sequencer 100 also receives a reset signal 36 that, when asserted by CPU 30, causes sequencer 100 to reset itself to a known stable state by reference to configuration parameters stored within non-volatile random access memory (NVRAM) 106. The operation of sequencer 100 is timed by a clock 108, which may be asynchronous relative to the clocks utilized to operate DUT 14.

Sequencer 100 is further connected to memory 110, which interfaces to DUT 14 through a Rambus™ ASIC cell (RAC) 112 that is coupled to DUT 14 by relays 92 and connector 24. The depicted arrangement of memory 110, RAC 112, connector 24 and DUT 14 simulates the memory subsystem of a personal computer system or other end-use environment of DUT 14. That is, DUT 14, much like the CPU of a computer system, issues commands and requests through its integrated memory controller. DUT 14 outputs commands and requests to RAC 112 utilizing high-speed Rambus™ Signal Levels (RSL) or Quad RSL (QRSL) signaling. RAC 112 converts commands, requests, and responses between the RSL or QRSL signaling employed by DUT 14 and the lower-speed CMOS-level signals utilized by memory 110. In addition, RAC 112 functions as a high performance parallel-to-serial and serial-to-parallel converter by packing and unpacking data packets communicated with memory 110 to and from narrower Rambus™ data words. A Rambus Signaling Levels (RSL) bus master 114 is also connected to the RSL pins of RAC 112. The RSL bus master 114 operates using clock 118 and under the control of the sequencer 100 by means of control lines 116.

During testing, sequencer 100 sets parametric controls for testing DUT 14, stores vector information into memory 110 for transfer to the pins of DUT 14, writes instructions and data into memory 110 for retrieval by DUT 14, and receives the results of testing based upon the information measured by the PMUs 80 or stored in memory 110 by DUT 14. In response to receipt of test results for DUT 14, sequencer 100 logs the test results in RAM 104 and compares the test results with correct results also stored in RAM 104 to make a pass/fail determination for DUT 14. Sequencer 100 manages the transfer of vectors by using control lines 116 to instruct RSL bus master 114 to transfer vectors stored in memory 110 to the pins of DUT 14, which is in test mode. DUT 14 interprets the vectors and places a response value onto the pins. Sequencer 100 also manages the transfer of self-test results by using control lines 116 to instruct RSL bus master 114 to store the output values on the pins of DUT 14 in memory 110.

As further shown in FIG. 2, communication between RAC 112 and DUT 14 is synchronized by a number of sets of clock signals including clocks 120, which are received by RAC 112 and DUT 14. Clocks 120 are selected by selector 124 from among a plurality of clock signals generated by clock sources 122 in response to clock select signals 38 output by CPU 30. The sets of clock signals utilized to synchronize communication with DUT 14 also include clock-from-master (CFM) clocks 130 generated by DUT 14 and clock-to-master (CTM) clocks 132 generated by RAC 112. In order to test the timing sensitivity of DUT 14, CFM clocks 130 and CTM clocks 132 each are passed through a respective one of programmable delays 134 and 136, which applies a delay specified by a respective one of tester logic (TL) delay signal 40 and DUT delay signal 42. Delays 134 and 136 each may be implemented, for example, with a Semtech Edge629 delay circuit and associated Semtech Edge693 driver circuit.

Figure 3:
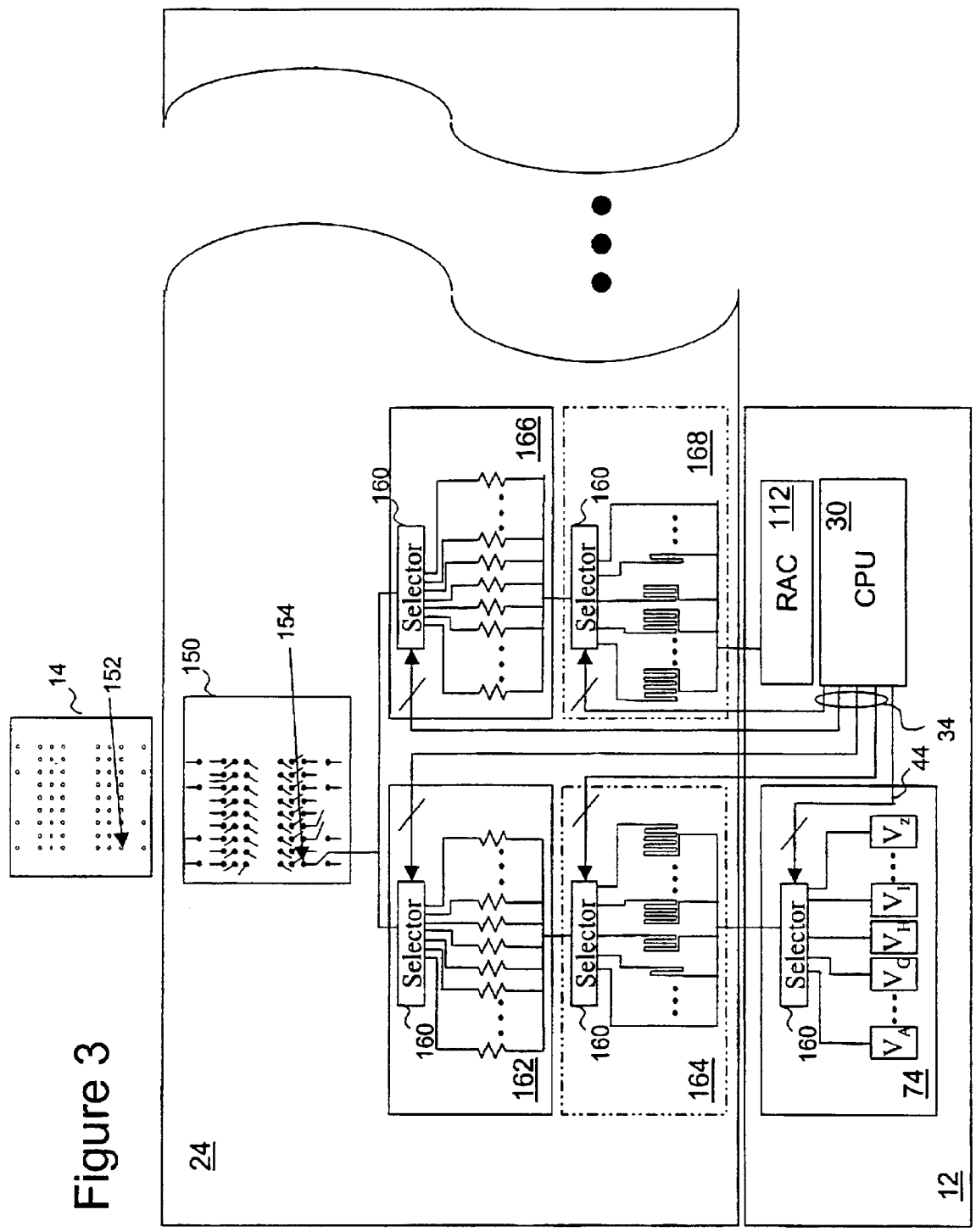
FIG. 3 depicts a portion of a wafer probe or test fixture for packaged devices having selectable termination impedance and propagation delay in accordance with a preferred embodiment of the present invention.

With reference now to FIG. 3, a detailed depiction of a preferred embodiment of connector 24 from FIGS. 1 and 2 is given. The illustrated embodiment, which is suitable for use with DUTs having Rambus™ memory controllers, includes a plurality of sites 150 (only one of which is shown), each of which has connections corresponding to the pinout of a DUT 14. For example, the illustrated DUT 14 is a logic device packaged in a micro-BGA package having a layout of 54 pads 152 in the form of solder balls or spring contacts, such as Microspring™ interconnection elements produced by FormFactor, Inc., of Livermore, Calif. Accordingly, site 150 has 54 connections 154, each corresponding to a respective one of pads 152. In a preferred embodiment, each connection 154 comprises a spring contact, such as a Microspring™ interconnection element produced by FormFactor, Inc., of Livermore, Calif.

Although the interconnection of only one connection 154 of site 150 is shown in FIG. 3 for clarity, each connection 154 of a site 150 forms one point of a three-point circuit having RAC 112 and variable $V_{TERM}$ supply 74 as termination points. As noted above, variable $V_{TERM}$ supply 74 can produce a plurality of different termination voltages (represented by voltages $V_A$–$V_Z$), only one of which is selected by a selector 160 to be the termination voltage $V_{TERM}$ in response to voltage select signals 44 provided by CPU 30.

Between each connection 154 and each of variable $V_{TERM}$ supply 74 and RAC 112, an impedance and an optional propagation delay element are connected in the signal path. That is, a termination impedance 162 and an optional first propagation delay element 164 are coupled between connection 154 and variable $V_{TERM}$ supply 74, and a test impedance 166 and an optional second propagation delay element 168 are coupled between connection 154 and RAC 112. In accordance with an important aspect of the present invention, the input impedance presented by each connection 154 of site 150, which is the sum of the contact impedance of connection 154 plus the parallel combination of termination impedance 162 and test impedance 166, is equivalent to the characteristic impedance of an end-use environment of DUT 14. For example, if the end-use environment is connection to sockets for Direct Rambus™ modules, such as Rambus™ In-line Memory Module (RIMM), Small Outline RIMM (SO-RIMM) or Media RIMM, the characteristic impedance is selected to be approximately 28 Ω, and more particularly, 28 Ω±10%. If, on the other hand, the end-use environment is a Direct Rambus™ channel, the characteristic impedance is selected to be approximately between 20 and 60 Ω. As shown, in a preferred embodiment, multiple end-use environments can be emulated and non-standard impedances outside of specified tolerances can be supported by implementing termination impedance 162 and test impedance 166 as variable impedances. In this preferred embodiment, a respective selector 160 selects impedances 162 and 166 from among a plurality of different impedances in response to select signals 34 provided by CPU 30.

Optional propagation delay elements 164 and 168 can be employed to test the timing sensitivity of DUT 14 to various propagation delays that result, for example, from different installation locations of RAC 112 on the Rambus™ channel. As illustrated, the operational effects of introducing various different propagation delays into the signal path between connector 154 and variable $V_{TERM}$ supply 74 or the signal path between connector 154 and RAC 112 can be tested through selection of trace run lengths by selectors 160 of propagation delay elements 164 and 168. As with impedances 162 and 166, the select signals 34 that control selectors 160 of propagation delay elements 164 and 168 are supplied by CPU 30. In an alternative embodiment of the present invention, the installation of DUT 14 at various locations on the Rambus™ channel can be simulated by including within connector 24 a series of dummy packaged devices that can be connected to the Rambus™ channel in a selectable order relative to DUT 14. In this manner, testing can simulate the installation of RAC 112 as the device closest to DUT 14, second closest to DUT 14, etc.

Figure 4:
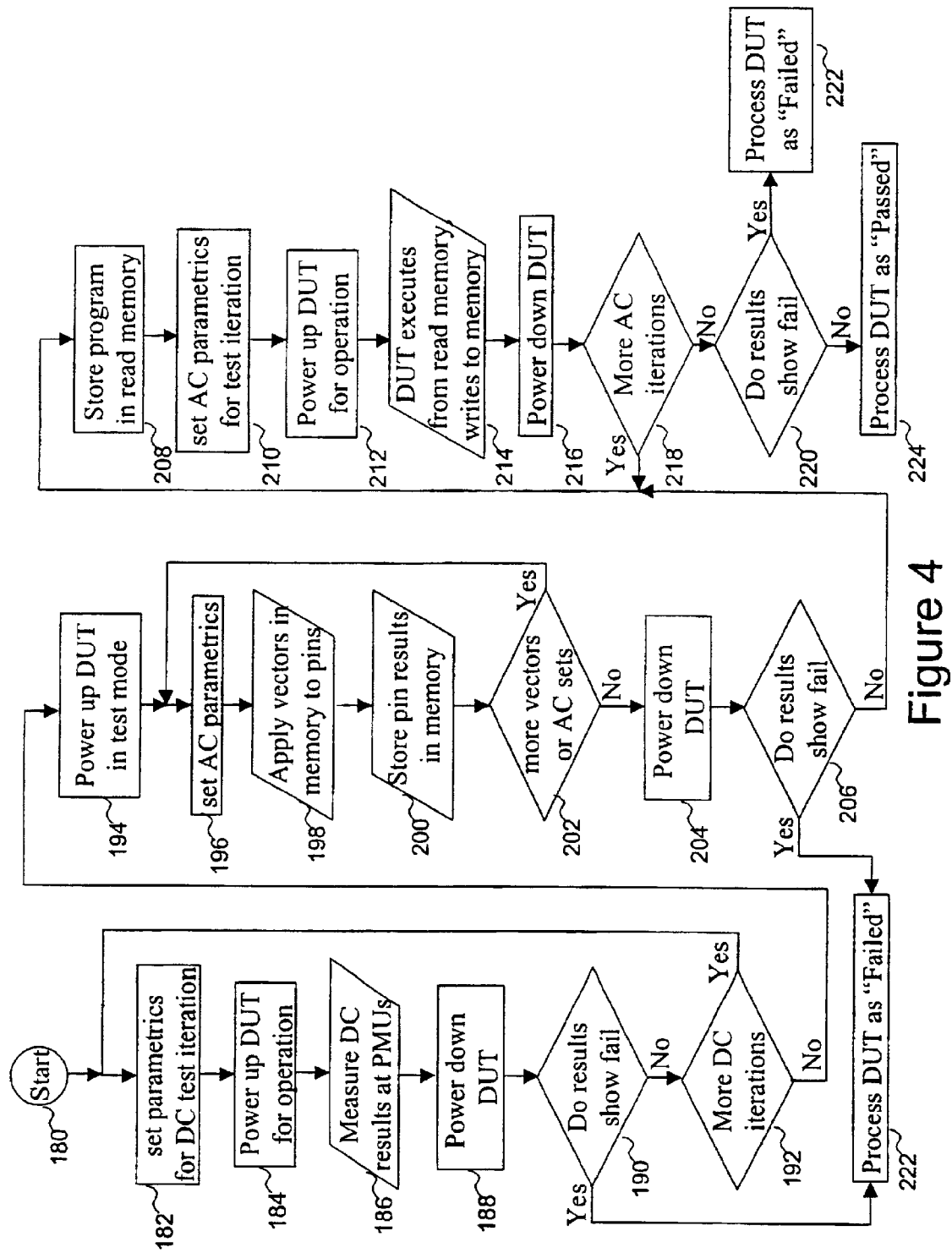
FIG. 4 is a high level flowchart of an exemplary test process in accordance with the present invention for testing logic devices with integrated memory controller.

With reference now to FIG. 4, there is illustrated a high-level logical flowchart of an exemplary test process for testing logic with memory controller circuits, either on wafer or in packaged devices, utilizing tester 10 from FIG. 1. As illustrated, the process begins at block 180 and then proceeds to block 182, which depicts CPU 30 setting parameters for a DC test of DUT 14. Power is then supplied to DUT 14, as shown at block 184. At block 186, tester 12 performs a DC parametric test upon a DUT 14 while the DUT 14 is idle. To perform the DC parametric tests for an exemplary logic device having a Rambus™ memory controller, CPU 30 sets relays 92 to connect the output pins of DUT 14 to PMUs 80 rather than RAC 112. PMUs 80 may then be utilized to measure the power dissipation of DUT 14 for one or more sets of $V_{REF}$, $V_{DD}$ and $V_{DDA}$ voltages, as well as the leakage current of the pins of DUT 14. These power and current measurements are then transferred to sequencer 100 via unillustrated connections for storage in RAM 104 and comparison with acceptable values to obtain a pass/fail determination.

The process proceeds from block 186 to block 188, which depicts powering down DUT 14. If at block 190, a determination is made that the DC test results indicate DUT 14 failed, the process branches to block 222 to process DUT 14 as a failure. If, however, DUT 14 passed the DC test and additional DC tests are to be performed, the process returns from decision block 192 to continue the loop comprising blocks 180 through 190 until all DC parametric testing is complete.

Following DC parametric testing, AC parametric testing may be performed, as depicted at blocks 194–206. At block 194, DUT 14 is powered on in order to perform a vector-based self-test. Block 196 illustrates CPU 30 setting the AC parameters to be utilized during the vector-based self-test. The vector-based self-test is then performed as illustrated at block 198 (which is described below), and the results are collected at block 200. As represented by decision block 202, logic testing using vectors (and each of the other AC tests) is preferably performed with multiple different sets of AC parameters in order to assess the proper operation of DUT 14 over a wide range of AC parameters. For DUTs 14 comprising logic devices with Rambus™ memory controllers, the AC parameters that can be varied during AC testing include those summarized below in Table I. Of course, for different DUTs, other or additional AC parameters can be tested.

TABLE I

| AC parameter | Description |
| --- | --- |
| $T_{CYCLE}$ | transfer clock frequency |
| $T_{SH}$ | combined setup and hold times for DUT (i.e., period defining valid WRITE data) |
| $T_Q$ | time to valid data output (i.e., period defining valid READ data) |
| $T_{TR}$ | time from transmit to receive (i.e., interval between consecutive READ and WRITE operations) |
| $V_{REF}$ | reference voltage that defines midpoint between the logic low input voltage ($V_{IL}$) and logic high input voltage ($V_{IH}$) |
| $V_{TERM}$ | termination voltage for Rambus ™ channel |

CPU 30 sets the $T_{CYCLE}$ parameter by generating appropriate clock selects 38 to select clock sources 122 of desired frequencies to supply clocks 120. In a typical testing scenario, it is desirable to select transfer clock frequencies below, at, and above the rated clock frequency of DUT 14. For example, for a DUT 14 using Rambus™ memory modules having a rated clock frequency of up to 533 MHz, it is desirable to perform testing at a number of transfer clock frequencies ranging from approximately 300 MHZ to approximately 584 MHz.

In order to test the sensitivity of DUT 14 to the timing of WRITE operations, CPU 30 stresses the $T_{SH}$ parameter by generating a TL delay signal 40 that selects a delay applied to the clock-from-master (CFM) and complementary clock-from-master negative (CFMN) signals 130 by delay 134. As shown in FIG. 5A, which illustrates signal timing without any delay, the high-to-low crossing of CFM with CFMN defines a timing of a valid period during which data (e.g., ROW, COL, DQA and DQB) and commands are generated by DUT 14. The extent of the valid period is equal to the sum of a setup time ($t_S$) prior to the crossing of CFM and CFMN during which the data and commands must be valid and a hold time ($t_H$) following the crossing of CFM and CFMN during which the commands must be stable. As shown in FIG. 5B, the sensitivity of DUT 14 to variations in WRITE timing can be tested by applying a delay to CFM and CFMN equal to a full cycle minus $\Delta t_1$. By doing so, the setup time ($t_S$) is effectively decreased by $\Delta t_1$, and the timing sensitivity of DUT 14 can be evaluated.

CPU 30 similarly tests the timing sensitivity of DUT 14 during READ operations by stressing the $T_Q$ parameter through generation of DUT delay signal 42 to select the delay applied by delay 136 to the clock-from-master (CTM) and the complementary clock-from-master negative (CTMN) signals 132 output to DUT 14 by RAC 112. As illustrated in FIG. 6A, which depicts signal timing without any applied delay, the high-to-low crossing of CTM with CTMN defines a timing of a period ($t_Q$) during which data (i.e., DQA and DQB) output by RAC 112 are valid for sampling by DUT 14. The extent of the valid period $t_Q$ is equal to the period of CTM minus the two intervals $t_{Q, MIN}$ and $t_{Q, MAX}$. As shown in FIG. 6B, the sensitivity of DUT 14 to variations in READ timing can be tested by applying a delay to CTM and CTMN equal to a full cycle minus $\Delta t_2$. By doing so, the valid period ($t_Q$) is effectively decreased by $\Delta t_2$, and the timing sensitivity of DUT 14 can be evaluated.

CPU 30 tests the $T_{TR}$ parameter by shifting the phase of CTM/CTMN relative to CFM/CFMN utilizing appropriate delay signals 40 and 42. By varying the relative timing of these clock signal pairs by small increments, CPU 30 can test DUT 14 for worst-case failures for consecutive READ and WRITE operations.

$V_{REF}$ and $V_{TERM}$ are set by CPU 30 utilizing voltage select signals 44 in order to test DUT 14 for supply voltage margin and launch voltage sensitivity, respectively. As discussed further below with reference to FIGS. 25 and 26, because DUT 14 calibrates $V_{IL}$ and $V_{IH}$ to $V_{REF}$, varying $V_{REF}$ also tests the sensitivity of DUT 14 to various input voltage levels without the need to actually vary the voltage levels of the data inputs provided to DUT 14.

Referring again to FIG. 4, after the AC parameters are set at block 196, CPU 30 downloads vector data and correct test results to sequencer 100, which stores them in memory 110. To exercise the self-test circuitry of DUT 14, sequencer 100 causes RSL bus master 114 to stimulate appropriate input pins of DUT 14 with the vector data at block 198. In addition, sequencer 100 tests the sensitivity of DUT 14 to various timings, voltages, impedances, and propagation delays. For exemplary logic devices having Rambus™ memory controllers, the probability of failure during testing can be increased or decreased by:

(1) varying termination impedance 162 and test impedance 166 while maintaining the characteristic impedance of an end-use environment or varying the impedance from the characteristic impedance of the end-use environment in order to affect the amplitude of the Rambus™ channel reflections; and/or (2) varying the delay applied by delay elements 164 and 168 to simulate different locations of DUT 14 on the Rambus™ channel, which affects the timing of reflections on the Rambus™ channel relative to the output of DUT 14; and/or (3) varying $V_{TERM}$ either above or below the standard value of 1.8±0.1 V.

Sequencer 100 causes RSL bus master 114 to log the results of the vector-stimulated self-test as shown in block 200. As illustrated at block 202, CPU 30 may then alter the AC parameters and repeat the vector-stimulated self-test utilizing the new AC parameters. When both the AC sets and vectors sets are complete, sequencer 100 powers down DUT 14 at block 204 and compares the test results with the correct results to produce a pass/fail determination at block 206. The process then branches to block 222 if a failure is detected and continues on to block 208 otherwise.

Block 208 depicts CPU 30 storing a test program into a section of memory 110 that can be accessed by DUT 14. Blocks 210–212 illustrate CPU 30 setting initial AC parameters for AC parametric testing and causing power to be supplied to DUT 14. At block 214, DUT 14 is directed to execute the test program stored in memory 110 and write output results into memory 110. Following execution of the test program, CPU 30 powers down DUT 14 at block 216. As represented by decision block 218, the process returns to block 208 and executes the loop continuing through block 216 until all AC parametric sets are complete for all test program sequences. After all AC parametric tests and test program sequences are complete, sequencer 100 finally compares the test results with the correct results to produce a pass/fail determination at block 220. The process branches to block 222 if a failure is detected and continues to block 224 to process the DUT 14 as "passing" otherwise.

The test program sequences used in loop comprising blocks 208 through 218 can include functional tests, command sets, or pattern-based tests. For example, for a logic device having a Rambus™ memory controller, the pattern-based tests can include the individual tests summarized below in Table II. In a typical pattern-testing embodiment, CPU 30 downloads the test program sequences and data patterns to sequencer 100 for storage in memory 110 at block 208. CPU 30 then establishes initial AC parameters for Rambus™ core accesses at block 210. DUT 14 is powered up at block 212, and as depicted at block 214, DUT 14 begins to read from memory 110 and execute the test sequence to issue WRITE and READ operations to verify correct operation of DUT 14. Results of the pattern testing are written into memory 110.

TABLE II

| Rambus ™ core test suite tests | Description |
| --- | --- |
| Address | ensures that all memory array locations can be accessed |
| Data | verifies that each memory bit operates as both a 1 and a 0 |
| Refresh | memory array properly retains data |
| March algorithms | data patterns written into memory arrays match those read out of memory arrays |
| Disturb Neighborhood Sensitivity Test (DNST) | modifying contents of a memory cell in the memory array does not modify data stored in neighboring memory cells |

Similarly for a logic device with Rambus™ memory controller, the test program sequences, which typically include channel command sets and correct results, are transferred by CPU 30 to sequencer 100 for storage in memory 110, as shown at block 208 of FIG. 4. As represented at block 214, DUT 14 executes the Rambus™ charnel commands from memory 110 and writes the results to memory 110.

Lastly for a logic device with Rambus™ memory controller, the test sequence used in block 214 by DUT 14 may also perform additional Rambus™ functional tests that verify DUT 14 works properly with the special functionality of Rambus™ memory. A number of these Rambus™ functional tests are summarized below in Table III.

TABLE III

| Rambus ™ functional tests | Description |
| --- | --- |
| Bank interleave | verify bank addressing of all memory banks |
| Write/Retire | checks operation of write retire buffer |
| Byte Operation Mask | verifies operation of mask programmed via the Rambus ™ COLM bus |
| NAP and Power Down | assures operation in low-power modes |

After the loop of blocks 208 through 218 has been completed all functional tests, command sets, or pattern-based test sequences for all desired sets of AC parameters, the test process shown in FIG. 4 ends at block 220, which depicts sequencer 100 relaying the pass/fail determinations from blocks 224 and 222, respectively, to CPU 30, which reports the pass/fail determinations for this DUT 14 to host 16.

Figure 7:
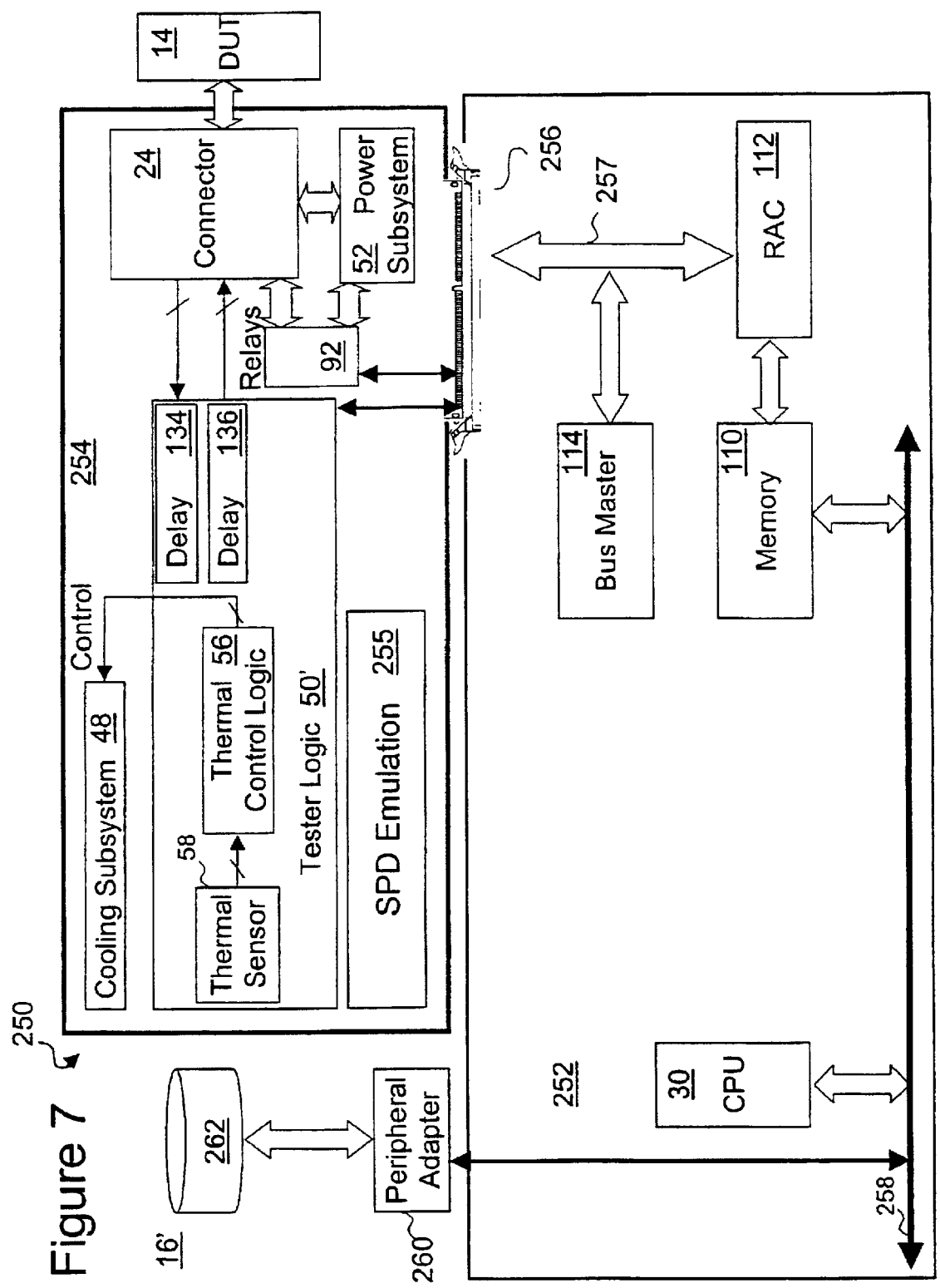
FIG. 7 illustrates a first alternative embodiment of a logic tester in accordance with the present invention for testing DUTs having Rambus™ memory controllers.

Referring now to FIG. 7, there is depicted a high-level block diagram of a host-based memory tester 250 in accordance with a first alternative embodiment of the present invention. Like reference numerals are utilized in FIG. 7 to identify elements that are the same as or similar to those of the memory tester embodiment illustrated in FIGS. 1–3.

As shown, memory tester 250 comprises a host 16' and a tester logic board 254. Host 16', which may comprise, for example, a conventional personal computer system or other data processing system, includes a system board 252 having an interconnect 258 to which a CPU 30, memory 110, and peripheral adapter 260 are coupled for communication. Peripheral adapter 260 is further coupled to a storage device 262, which provides non-volatile storage for test procedures, test parameters, and test data. Memory 110 is coupled to RAC 112, which is in turn connected to a standard Rambus™ channel 257 communicating with a connector 256 mounted on system board 252. Bus master 114 is also connected to Rambus™ channel 257.

Memory tester 250 employs a host-based tester architecture that permits CPU 30 of host 16' to test a logic DUT having an Rambus™ memory controller DUT 14 as if DUT 14 were mounted on a standard board with Rambus™ channel through the installation, in connector 256, of a tester logic board 254 having a impedance-controlled connector 24 for DUT 14. Like tester logic board 12 of FIG. 2, tester logic board 254 includes a cooling subsystem 48 and a power subsystem 52, as well as tester logic 50'. In the first alternative embodiment shown in FIG. 7, tester logic 50' is greatly simplified as compared to tester logic 50 of FIG. 2 in that no sequencer 100 is required and the memory 110 and RAC 112 utilized for testing are mounted on system board 252. The one major addition to tester logic 50' is a serial presence detect (SPD) emulation circuit 255 which may be needed to identify memory 110 and RAC 112 to DUT 14 as a Rambus™ memory module upon system reset. Information regarding the operation of SPD emulation circuit 255 may be found, for example, in *Direct Rambus™ SPD Specification*, rev. 1.1, Rambus, Inc., June 2000, which in incorporated herein by reference.

In operation, memory tester 250 utilizes the test information stored by storage device 262 (or remotely stored test information communicated via a network connection) to test DUT 14 according to the test process depicted in FIG. 4 and described above. The major difference in the manner in which testing is performed by the embodiment of FIG. 7 is that CPU 30 directly accesses memory 110 by issuing an appropriate request on interconnect 258. In response to the request by DUT 14 over Rambus™ channel 257, RAC 112 accesses memory 110 for read and write operations. CPU 30 can then compare the responses written into memory 110 by DUT 14 with expected results to make pass/fail determinations for the various tests. The first alternative embodiment shown in FIG. 7 offers the use of specific system board, which may be a production environment for DUT 14.

Figure 8:
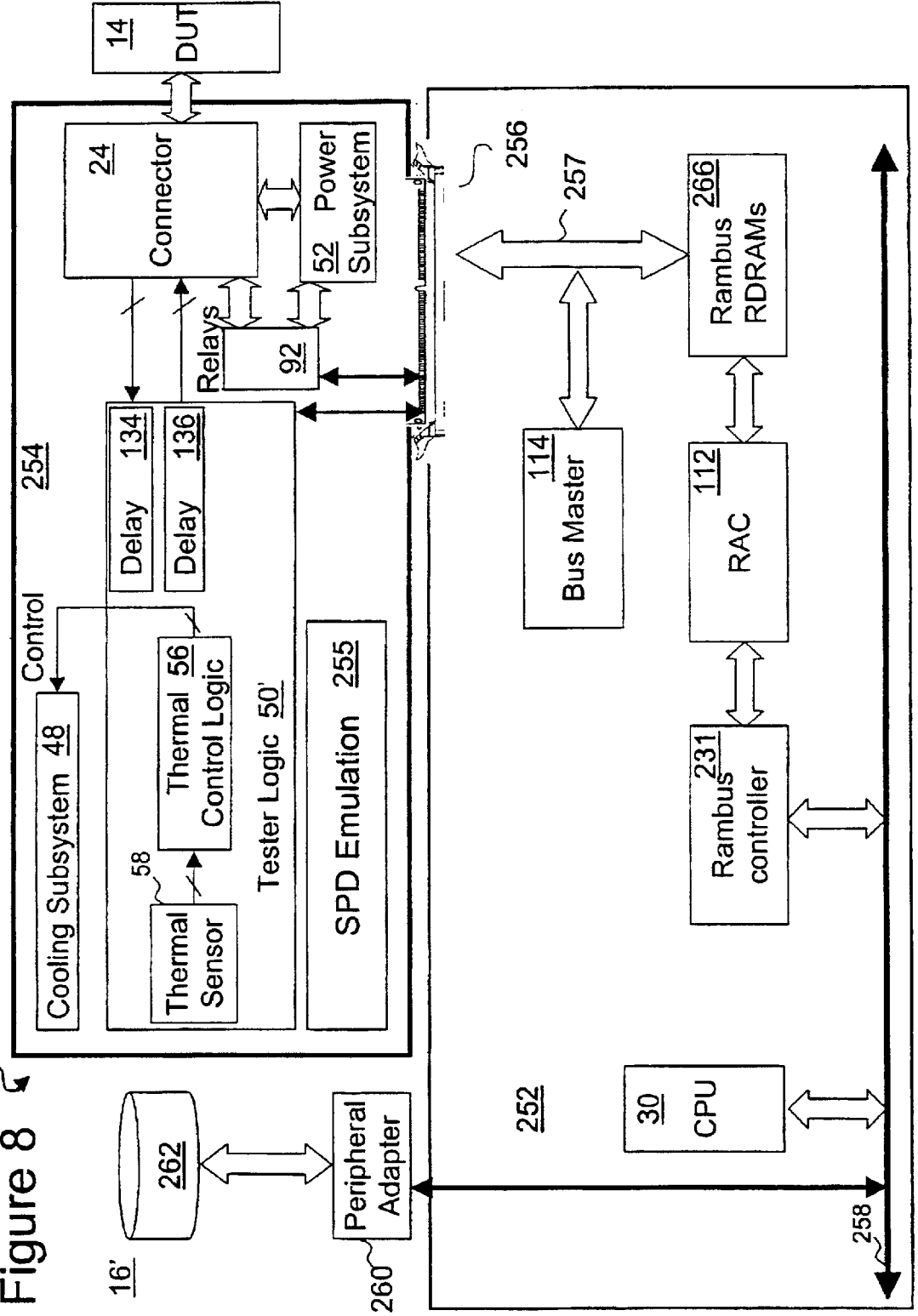
FIG. 8 illustrates a second alternative embodiment of a logic tester in accordance with the present invention for testing DUTs having Rambus™ memory controllers.

Referring now to FIG. 8, there is depicted a high-level block diagram of a host-based memory tester 250 in accordance with a second alternative embodiment of the present invention. In FIG. 8, like reference numerals are utilized to identify elements that are the same as or similar to those of the memory tester embodiment illustrated in FIGS. 1–3 and FIG. 7. FIG. 8 differs from FIG. 7 in the use of Rambus RDRAM memory devices 266, rather than a discrete RAC 112 and memory 110. Access by CPU 30 to Rambus RDRAMs 266 is now through Rambus controller 231 and RAC 112. The second alternative embodiment shown in FIG. 8 offers the use of specific system board, which may be a production environment for DUT 14.

Figure 9:
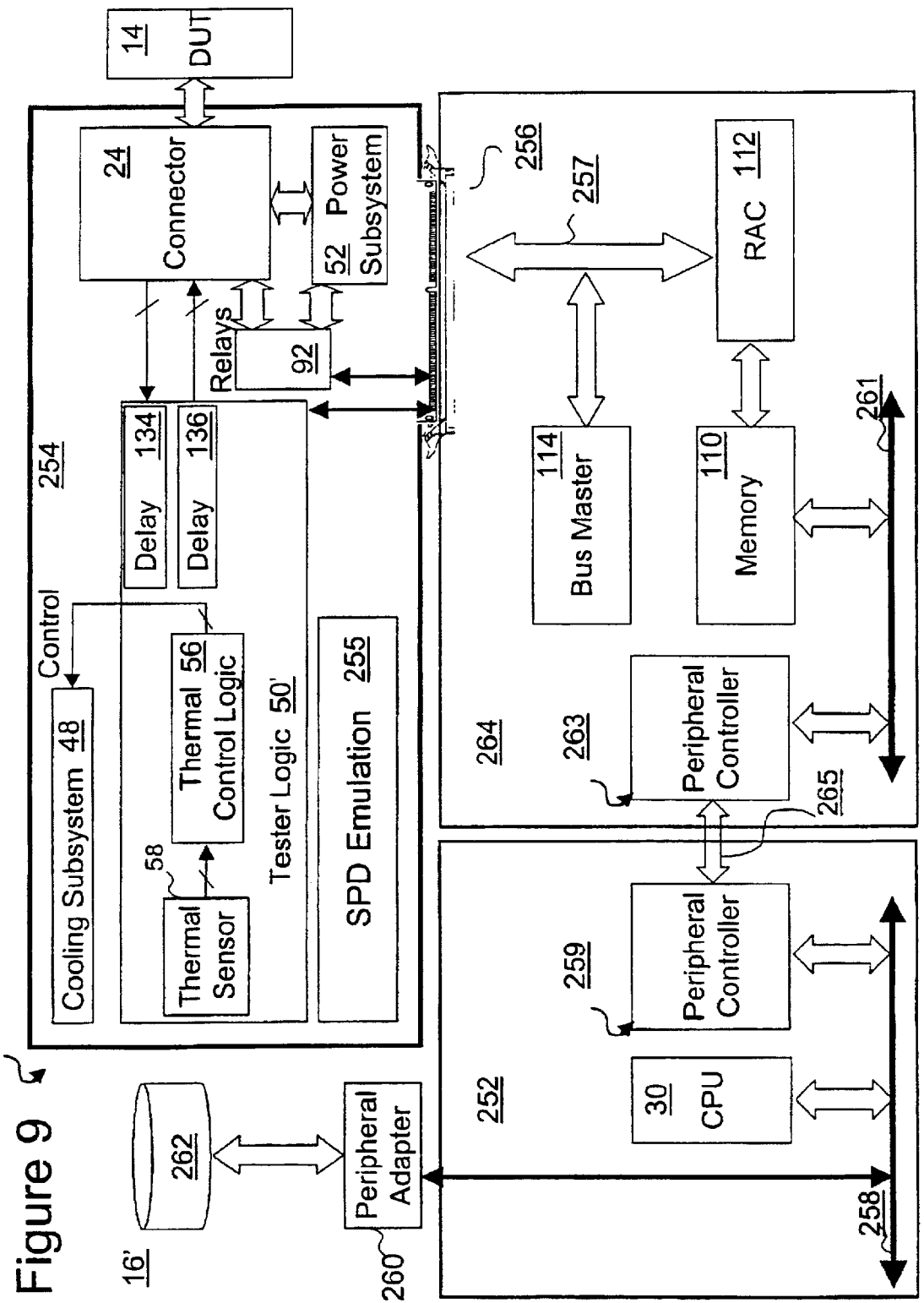
FIG. 9 illustrates a third alternative embodiment of a logic tester in accordance with the present invention for testing DUTs having Rambus™ memory controllers.

Referring now to FIG. 9, there is depicted a high-level block diagram of a host-based memory tester 250 in accordance with a third alternative embodiment of the present invention. In FIG. 9, like reference numerals are utilized to identify elements that are the same as or similar to those of the memory tester embodiment illustrated in FIGS. 1–3 and FIGS. 7–8. As shown in FIG. 9, CPU 30 is located on system board 252, while memory 110 is located on peripheral board 264, which connects to DUT 14 by means of tester logic board 254. CPU 30 accesses memory 110 through peripheral interconnect 265. CPU 30 accesses peripheral interconnect 265 through local interconnect 258 and peripheral controller 259. Peripheral interconnect 265 accesses memory 110 through peripheral controller 263 and local interconnect 261. The third alternative embodiment shown in FIG. 9 offers the use of specific combinations of system and peripheral boards, which may be a production environment for DUT 14.

Referring now to FIG. 10, there is depicted a high-level block diagram of a host-based memory tester 250 in accordance with a fourth alternative embodiment of the present invention. In FIG. 10, like reference numerals are utilized to identify elements that are the same as or similar to those of the memory tester embodiment illustrated in FIGS. 1–3 and FIG. 9. FIG. 10 differs from FIG. 9 through the use of Rambus RDRAM memory devices 266, rather than discrete RAC 112 and memory 110. Access by CPU 30 to the Rambus RDRAMs 266 is now through Rambus controller 231 and RAC 112.

Figure 11A:
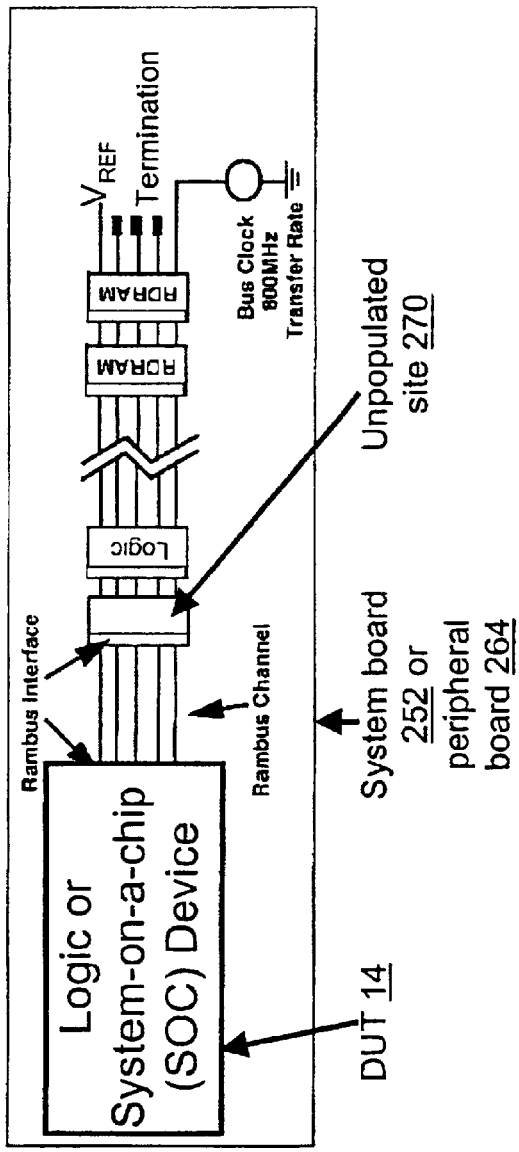
FIGS. 11A–11C together illustrate a first fixture embodiment for a logic tester for DUTs already manufactured onto circuit boards in accordance with the present invention, wherein the DUTs contain Rambus™ memory controllers.
Figure 11C:
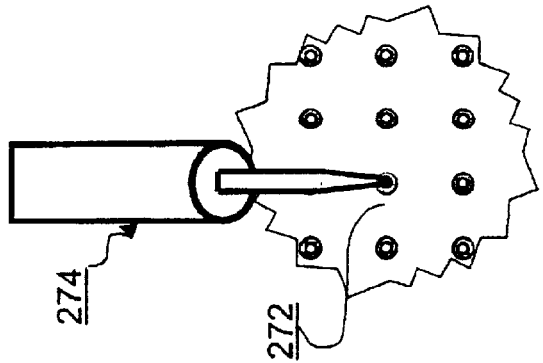
Figure 11B:
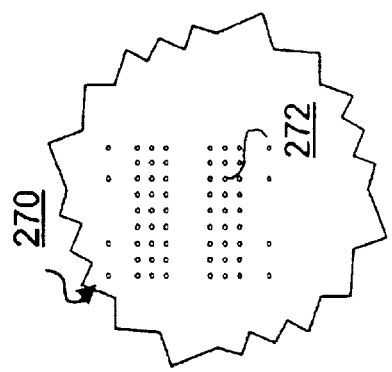

Referring now to FIG. 11A, there is depicted a high-level block diagram of a first embodiment of test fixture embodiment capable of testing a DUT 14 already manufactured onto a circuit board. DUT 14 is able to communicate with a logic tester 250 through connection to an unpopulated device site on the Rambus channel 270. FIG. 11B is a more detailed depiction of an unpopulated device site 270 on the Rambus channel having a plurality of pads, including pad 272. FIG. 11C shows a single finger of a controlled impedance probe 274, which interfaces with connector 24 of logic tester 250 by contacting pad 272. The controlled impedance probe 274 allows DUT 14 to communicate with logic tester 250 via unpopulated device site on the Rambus channel 270 as if DUT 14 was directly connected to the connector 24 of logic tester 250. The test fixture embodiment shown in FIGS. 11A–11C offers the ability to test many functions of system board 252 or peripheral board 264 after DUT 14 is manufactured onto the circuit board.

Figure 12A:
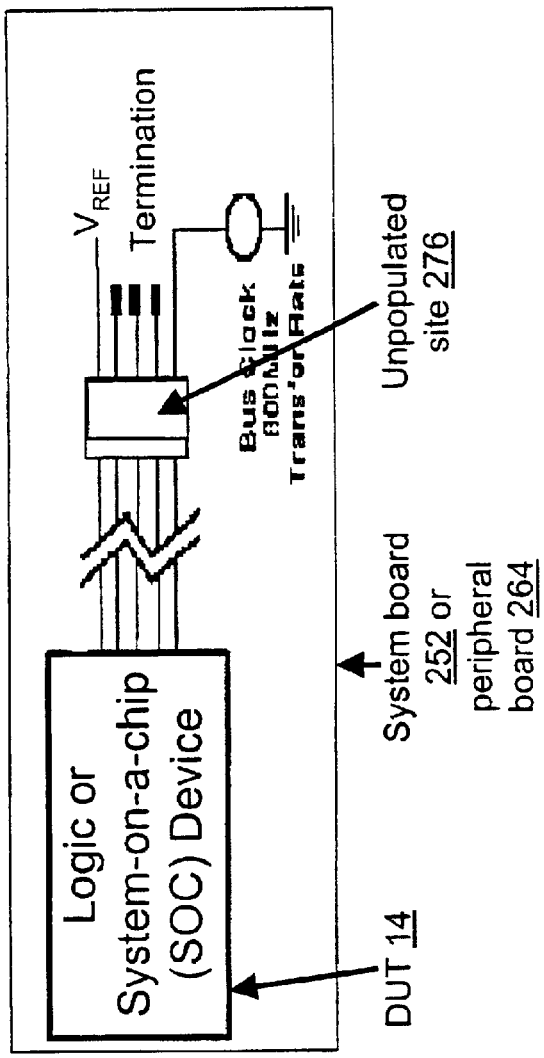
FIGS. 12A–12B together depict a second fixture embodiment for a logic tester for DUTs already manufactured onto circuit boards in accordance with the present invention, wherein the DUTs contain Rambus™ memory controllers.
Figure 12B:
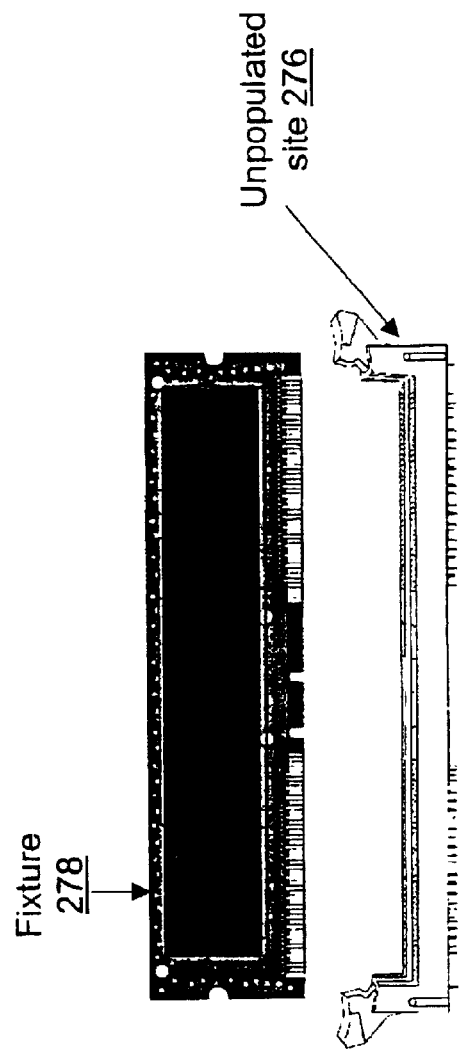

Referring now to FIG. 12A, there is depicted a high-level block diagram of a second embodiment of a test fixture capable of testing a DUT 14 already manufactured onto a circuit board. DUT 14 is able to communicate with logic tester 250 through connection to an unpopulated Rambus connector 276, such as a socket for a Rambus memory module. FIG. 12B shows a more detailed depiction of an unpopulated Rambus connector 276 for a Rambus memory module. Controlled impedance fixture 276 interfaces with connector 24 of logic tester 250 by contacting unpopulated Rambus connector 276, thereby allowing DUT 14 to communicate with logic tester 250. This second embodiment allows DUT 14 to communicate with logic tester 250 via unpopulated Rambus connector 276 as if DUT 14 were directly connected to the connector 24 of logic tester 250. The second alternative embodiment fixture for testing DUT 14 shown in FIGS. 12A–12B offers the ability to test many functions of system board 252 or peripheral board 264 after DUT 14 is manufactured onto the circuit board.

Figure 13:
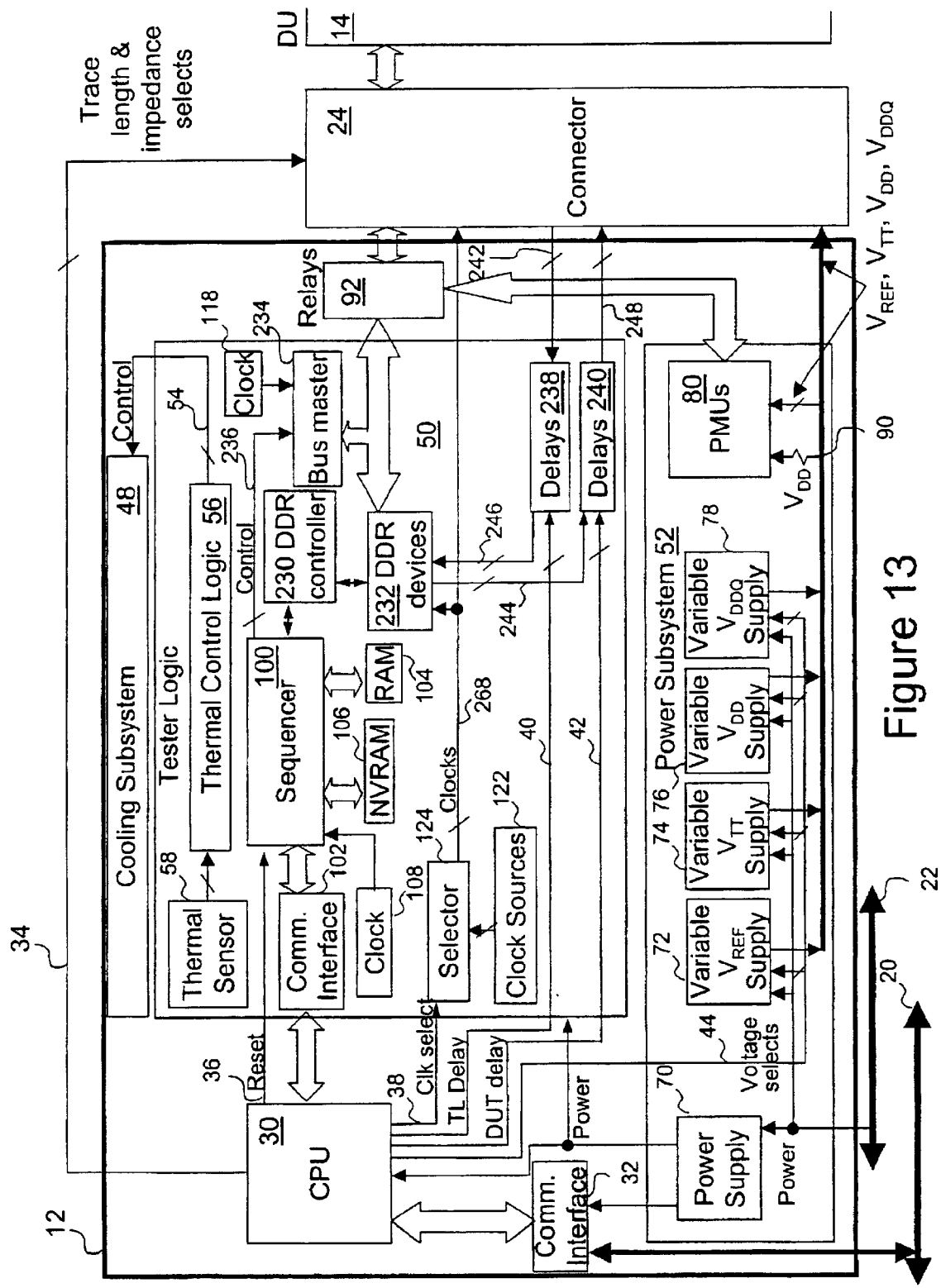
FIG. 13 is a more detailed block diagram of a second tester logic card in the logic tester illustrated in FIG. 1.

Referring now to FIG. 13, there is illustrated a more detailed block diagram of a tester logic board 12 from FIG. 1 in accordance with a second preferred embodiment of the present invention. In FIG. 13, like reference numerals are utilized to identify elements that are the same as or similar to those of the memory tester embodiment illustrated in FIGS. 1–2. The depicted embodiment includes circuitry specifically designed for testing logic DUTs having integrated Double Data Rate (DDR) synchronous DRAM memory control circuitry; however, those skilled in the art will appreciate that the present invention is not limited to testing logic DUTs having DDR memory controllers, but is instead applicable to testing other types of integrated circuitry. References useful for an understanding of the depicted embodiment of the present invention include the following DDR documentation (which is incorporated herein by reference):

a) *JEDEC standard JESD79: Double Data Rate (DDR) SDRAM Specification*, release 1, JEDEC Solid State Technology Association, June 2000;

b) *JEDEC standard No. 21-C: 45.10-184 Pin Unbuffered DDR SDRAM DIMM FAMILY*, release 9, JEDEC Solid State Technology Association, pages 4.5.1–1 to 4.5.10–17;

c) *Application Note XAPP200: Virtex Series and Spartan-II Family: Synthesizable 1.6 GBytes/s DDR SDRAM Controller*, ver. 2.3, Xilinx Inc., Jennifer Tran, Mar. 21, 2000;

As shown in FIG. 13, tester logic board 12 differs from that illustrated in FIG. 2 in that elements specific to logic devices using RSL transfers, including memory 110, RAC 112, RSL bus master 114, control signals for the RSL bus master 116, clocks 120, CFM signal 130, CTM signal 132, CFM delay 134, and CTM delay 136, are eliminated. New elements illustrated in FIG. 13 for logic devices using communication over a DDR memory bus include DDR memory controller 230, DDR memory devices 232, DDR bus master 234, control signals 236 for DDR bus master 234, data and strobe signals (DQ_IN and DQS_IN) 242, DQ_IN and DQS_IN delay circuits 238, delayed data and strobe signals (DQ_IN and DQS_IN) 246 into the tester logic, data and strobe signals (DQ_OUT and DQS_OUT) 244, DQ_OUT and DQS_OUT delay circuits 240, delayed data and strobe signals (DQ_OUT and DQS_OUT) 248 into DUT 14, and clocks 268. In addition, the voltages output by the variable power supplies (elements 72–78) and the characteristic impedance of the apparatus are changed from those appropriate for logic devices using RSL transfers to those for logic devices using communication over a DDR memory bus.

Figure 14A:
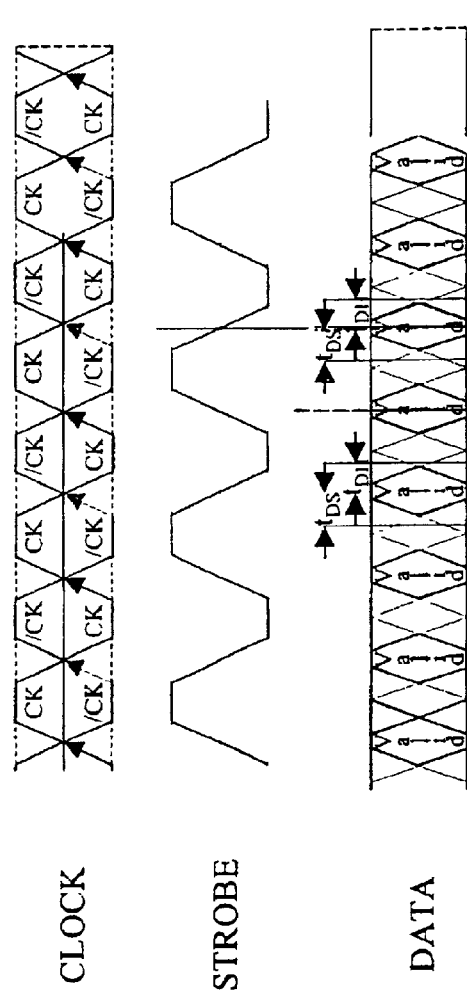
FIG. 14A is a timing diagram illustrating the timing of data and strobe DQS signals provided by a DDR memory controller in a logic DUT in relation to the setup and hold times of WRITE operations.
Figure 14B:
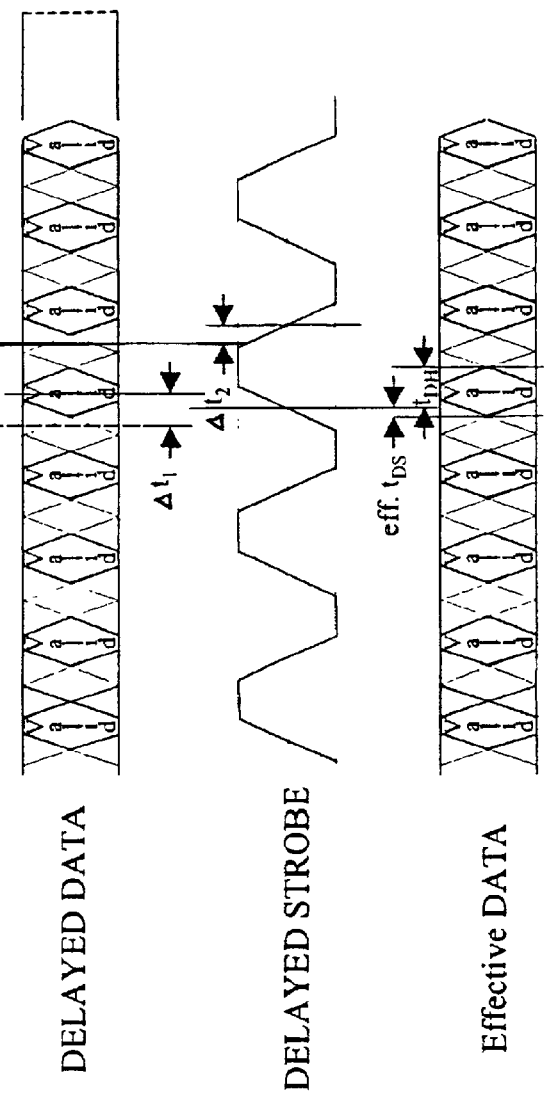
FIG. 14B is a timing diagram depicting the use of a programmable delay in the timing of data and strobe DQS signals provided by the DDR memory controller in a logic DUT to test the timing sensitivity of WRITE operations.

Accesses by DUT 14 for WRITE operations to and READ operations from DDR memory devices 232 permit testing of logic DUTs having integrated DDR memory control circuits utilizing the methodology illustrated in FIG. 4. In order to test the sensitivity of DUT 14 to the timing of WRITE operations, CPU 30 stresses the $T_{DS}$ and $T_{DH}$ parameters by generating a TL delay signal 40 that selects delays separately applied to DQ_IN and DQS_IN 242 by delay devices 238. As illustrated in FIG. 14A, which depicts signal timing without any delay, the high-to-low crossing of CK with /CK defines a timing of a valid period during which data (DQ) and strobe (DQS) are generated by DUT 14. The extent of the valid period is equal to the sum of a setup time ($t_{DS}$) prior to the crossing of CK and /CK during which the data must be valid and a hold time ($t_{DH}$) following the crossing of CK and /CK during which the data must be stable. As shown in FIG. 14B, the sensitivity of DUT 14 to variations in WRITE timing can be tested by applying delays separately to data DQ_IN ($\Delta t_1$) and strobe DQS_IN ($\Delta t_2$) in such a manner that $\Delta t_1$ is greater than $\Delta t_2$. By doing so, the setup time ($t_{DS}$) is effectively decreased by the difference $\Delta t_1$ minus $\Delta t_2$, and the timing sensitivity of DUT 14 for the setup time ($t_{DS}$) can be evaluated. Similarly, the required hold time ($t_{DS}$) for successful WRITE operations may be effectively forced longer by delaying strobe DQS_IN longer than data (DQ_IN).

Figure 15A:
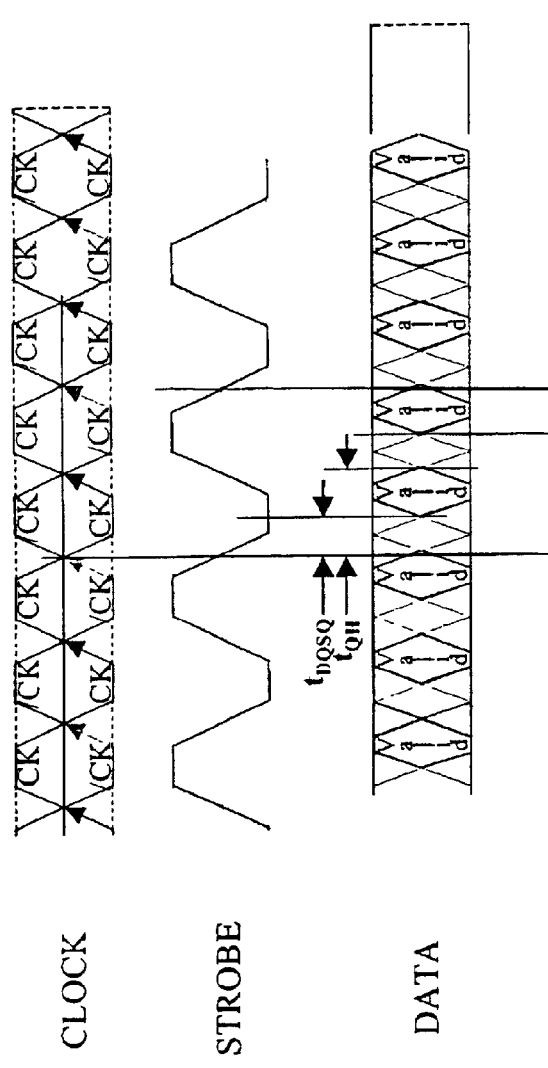
FIG. 15A is a timing diagram illustrating the timing of data and strobe DQS signals provided by the DDR memory controller in a logic DUT in relation to valid times for READ transactions.
Figure 15B:
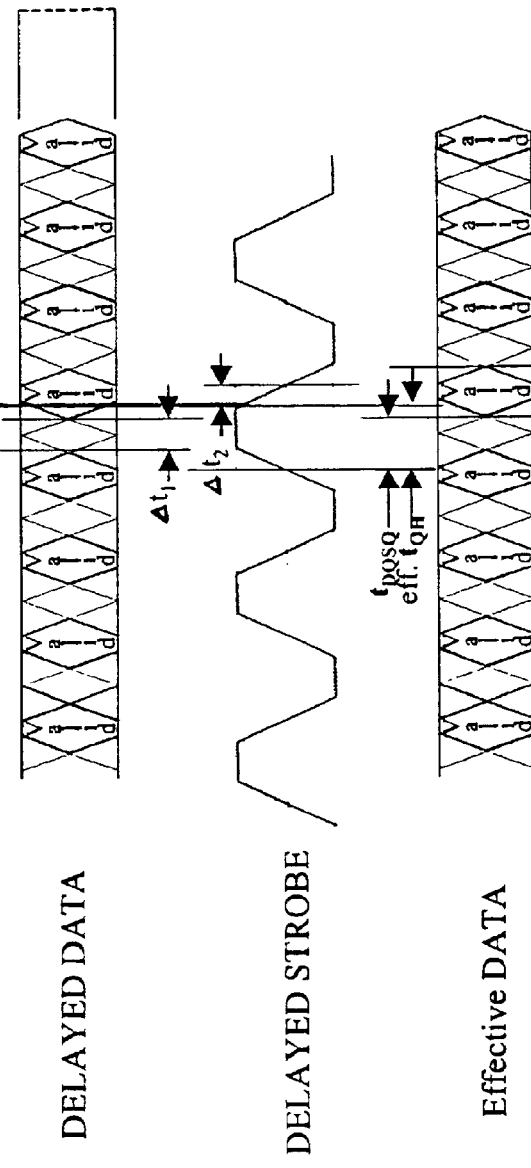
FIG. 15B is a timing diagram depicting the use of a programmable delay in the timing of data and strobe DQS signals provided by the DDR memory controller in a logic DUT to test the timing sensitivity of READ operations.

CPU 30 similarly tests the timing sensitivity of DUT 14 during READ operations by stressing the $T_{DQSQ}$ and $T_{QH}$ parameters through generation of DUT delay signal 42 to select the delay applied by delay devices 240 separately to the DQ_OUT and DQS_OUT signals 244 output to DUT 14 by DDR memory devices 232. As illustrated in FIG. 15A, which depicts signal timing without any applied delay, the high-to-low crossing of CK and /CK defines the timing of a period during which data (DQ) and strobe (DQS) output by DDR memory devices 232 are valid for sampling by DUT 14. As shown in FIG. 15B, the sensitivity of DUT 14 to variations in READ timing can be tested by applying delays separately to data DQ_IN ($\Delta t_1$) and strobe DQS_IN ($\Delta t_2$) in such a manner that $\Delta t_1$ is greater than $\Delta t_2$. By doing so, the start of the valid data output ($T_{QH}$ minus $T_{DQSQ}$) is effectively delayed by $\Delta t_1$ minus $\Delta t_2$. This delay narrows the window between the start of valid data output ($T_{DQSQ}$) and the time at which DUT 14 expects completion of the READ operation, thereby permitting evaluation of the timing sensitivity of DUT 14 for successful READ operations.

Figure 16:
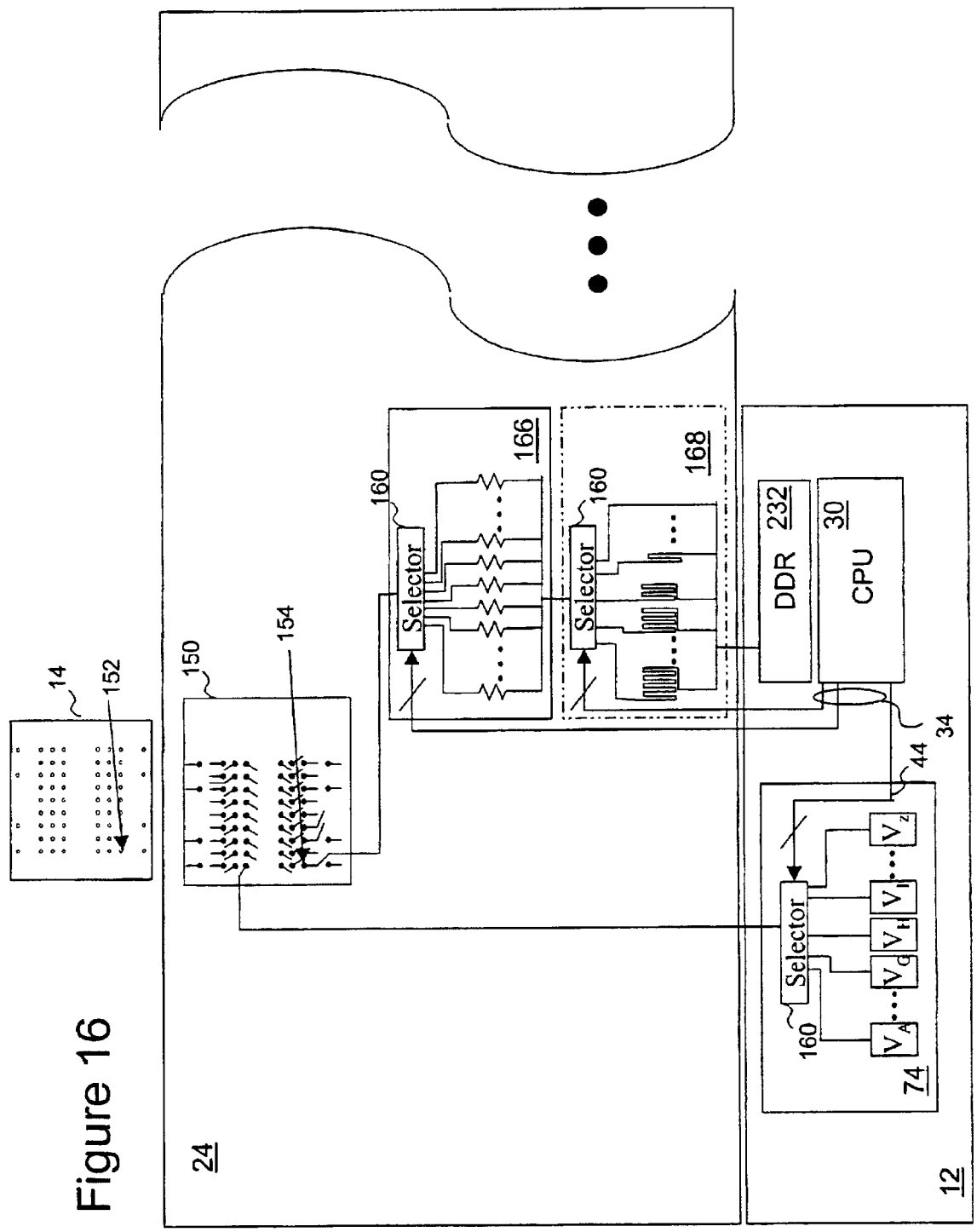
FIG. 16 depicts a portion of a wafer probe or test fixture for packaged devices utilizing DDR memory, where the wafer probe or test fixture has selectable impedance and propagation delay in accordance with a preferred embodiment of the present invention.

With reference now to FIG. 16, a detailed depiction of a preferred embodiment of a connector 24 from FIGS. 1 and 13 is given. The illustrated embodiment includes some major differences from the connector illustrated in FIG. 3, corresponding to differences between communication over a DDR memory bus versus an interconnect conveying RSL transfers, as illustrated in FIG. 3. For example, instead of RAC 112 being the termination point of transfers with DUT 14 as illustrated in FIG. 3, DDR memory devices 232 are the termination point for data transfers in the embodiment shown in FIG. 16. In addition, the voltage parameter determined by variable voltage supply 74 to test the sensitivity of DUT 14 is $V_{REF}$, which is selected by variable voltage supply 74 in response to voltage select signals 44 provided by CPU 30. Since $V_{REF}$ is applied to only one pin of exemplary logic device using communication over a DDR memory bus DUT 14, elements 164 and 162 from FIG. 3 do not exist in FIG. 16.

In accordance with an important aspect of the present invention and as illustrated in FIG. 16, the input impedance presented by each connection 154 of site 150 is equivalent to the characteristic impedance of an end-use environment of DUT 14. For example, if the end-use environment is a socket connection for JEDEC standard DDR modules, such as an 184-pin unbuffered DDR SDRAM DIMM, the characteristic impedance is selected to be approximately 60 Ω, and more particularly, 60 Ω±10%.

Optional propagation delay element 168 and optional impedance element 166 can be employed to test the sensitivity of DUT 14 to various propagation delays and impedances that result, for example, from different installation locations of DDR memory devices 232 on the DDR memory bus. In an alternative embodiment of the present invention, the installation of DUT 14 at various locations on the DDR memory bus can be simulated by including within connector 24 a series of dummy packaged devices that can be connected to the DDR memory bus in a selectable order relative to DUT 14. In this manner, testing can simulate the installation of DDR memory devices 232 as the memory device or module closest to DUT 14, second closest to DUT 14, etc.

Figure 17:
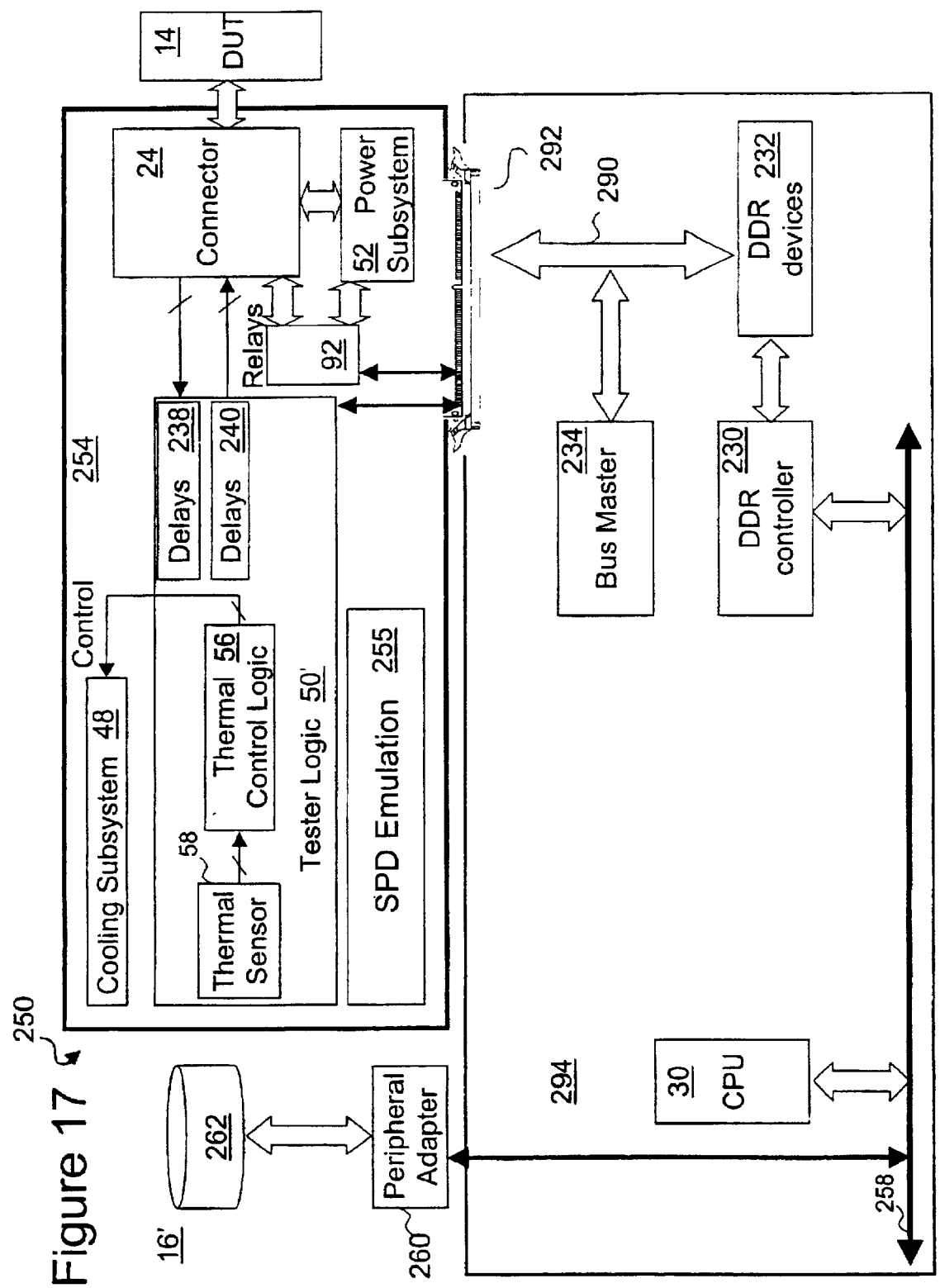
FIG. 17 illustrates a first alternative embodiment of a logic tester in accordance with the present invention for testing devices having DDR memory controllers.

Referring now to FIG. 17, there is depicted a high-level block diagram of a host-based memory tester 250 employing DDR memory in accordance with a first alternative embodiment of the present invention. In FIG. 17, like reference numerals are utilized to identify elements that are the same as or similar to those of the host-based memory tester embodiment illustrated in FIG. 7. Changes made to the embodiment shown in FIG. 7 to support a DUT 14 that employs DDR communication instead RSL transfers include replacement of connector 256 with connector 292, standard Rambus™ channel 257 with DDR memory bus 290, RSL bus master 114 with DDR bus master 234, and the combination of memory 110 and RAC 112 with DDR memory controller 230 and DDR memory devices 232, respectively. In addition, fundamental changes to system board 294 that are not important to the present invention make it distinctly different from system board 252 illustrated in FIG. 7.

Figure 18:
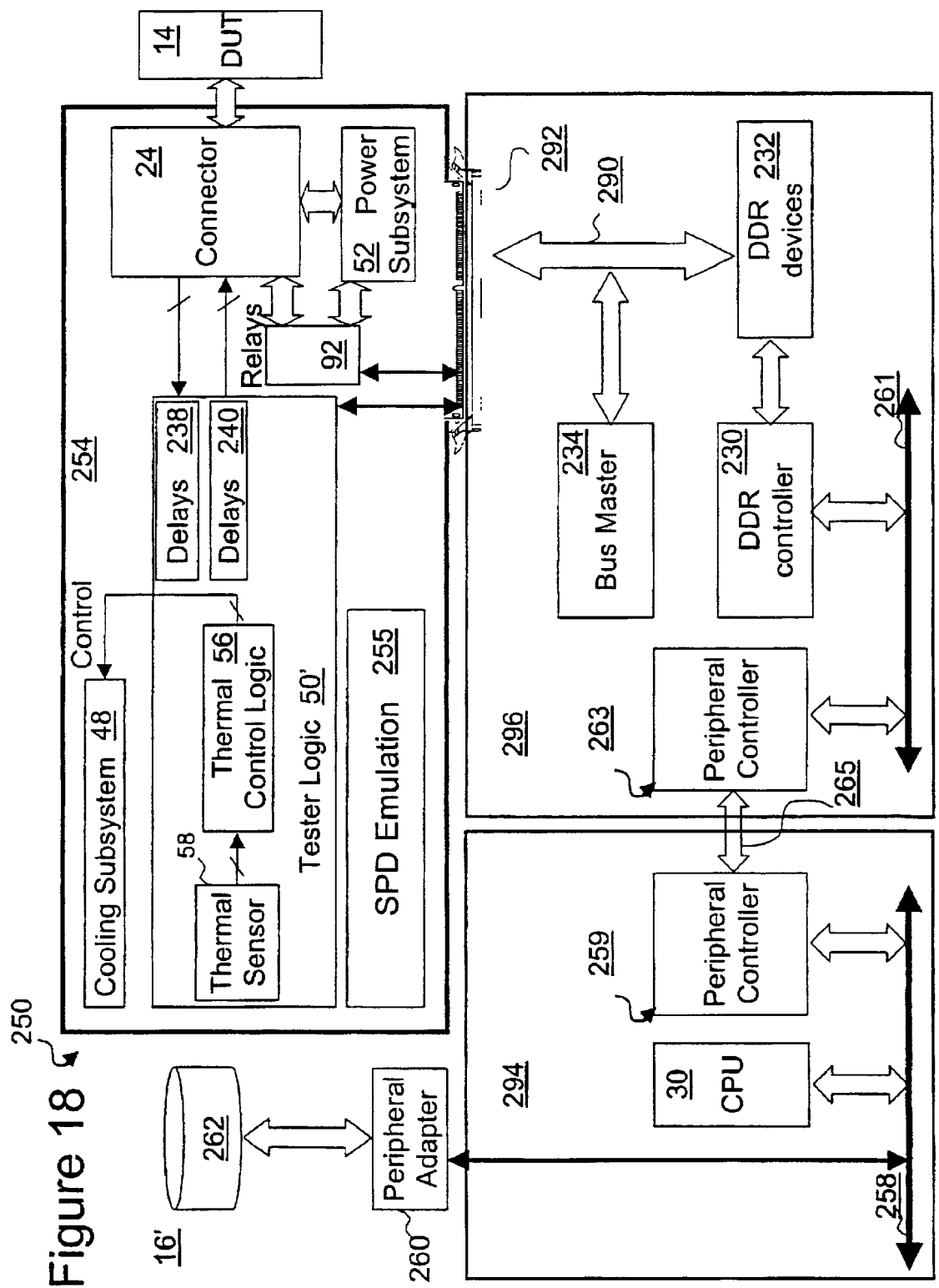
FIG. 18 illustrates a second alternative embodiment of a logic tester in accordance with the present invention for testing devices having DDR memory controllers.

Referring now to FIG. 18, there is depicted a high-level block diagram of a host-based memory tester 250 employing DDR memory in accordance with a second alternative embodiment of the present invention. In FIG. 18, like reference numerals are utilized to identify elements that are the same as or similar to those of the host-based memory tester embodiment illustrated in FIG. 9. However, there are a number of differences between the embodiments shown in FIGS. 9 and 18 that reflect the use of DDR communication in the embodiment of FIG. 18 instead of the RSL transfers employed in the embodiment illustrated in FIG. 9. These differences include replacement of connector 256 with connector 292, standard Rambus™ channel 257 with DDR memory bus 290, RSL bus master 114 with DDR bus master 234, and the combination of memory 110 and RAC 112 with DDR memory controller 230 and DDR memory devices 232, respectively. In addition, fundamental changes to system board 294 and peripheral board 296 that are not important to the present invention make them distinctly different from system board 252 and peripheral board 264 illustrated in FIG. 9.

Figure 19A:
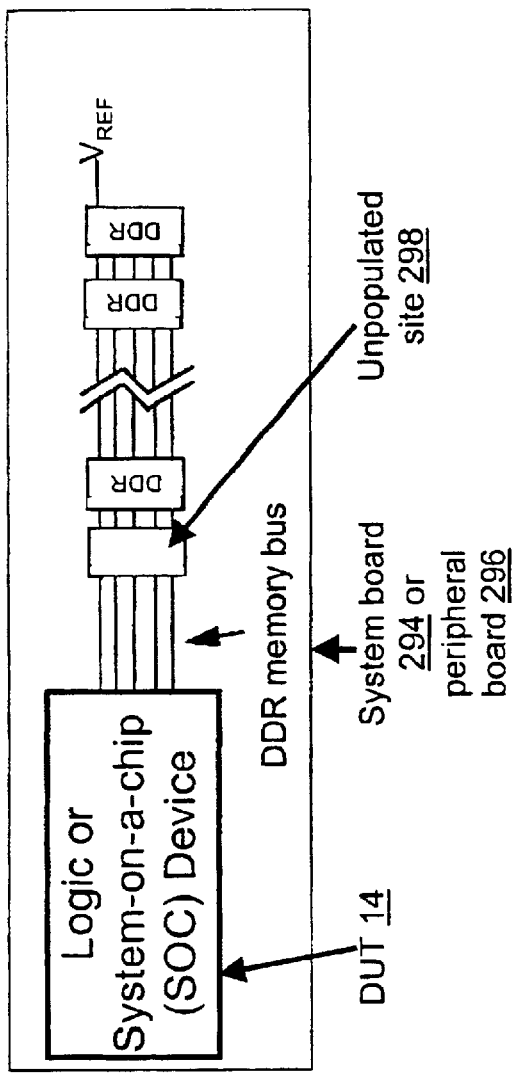
FIGS. 19A–19C illustrate a first fixture embodiment for a logic tester for testing DUTs having DDR memory controllers, wherein the DUTs are manufactured onto circuit boards.
Figure 19C:
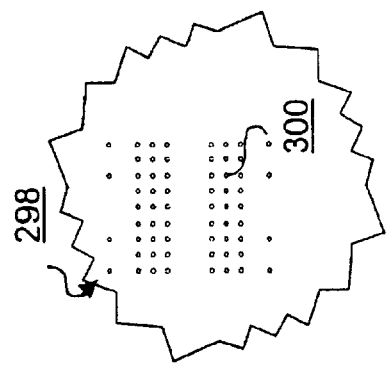
Figure 19B:
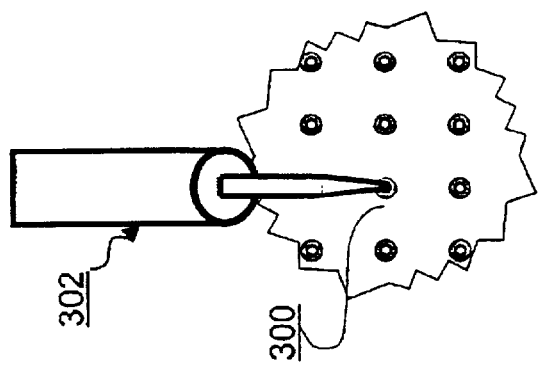

Referring now to FIGS. 19A–19C, there is depicted a first embodiment of a test fixture for testing DUTs 14 that employ communication over a DDR memory bus, where the DUTs are manufactured onto circuit boards. As can be seen by comparison of FIG. 19A with FIG. 11A, the two test fixture embodiments are somewhat similar. However, in order to support use of DDR communication in the embodiment of FIG. 19A, there are a number of differences from the embodiment illustrated in FIG. 11A. These differences include replacement of unpopulated device site 270 on the Rambus channel with unpopulated device site 298 on the DDR memory bus. Fundamental changes to system board 294 and peripheral board 296 not important to the present invention make them distinctly different from system board 252 and peripheral board 264 illustrated in FIG. 11A.

FIG. 19B depicts a more detailed view of unpopulated site 298 on the DDR memory bus. As shown, the plurality of connections at unpopulated site 298 include pad 300. As shown in FIG. 19C, a single finger 302 of a controlled impedance probe contacts pad 300, while other unillustrated fingers contact others of the plurality of pads in unpopulated site 298. This arrangement allows DUT 14 to communicate with logic tester 250 via unpopulated device site 298 on the DDR memory bus as if DUT 14 were directly connected to a connector 24 of logic tester 250.

Referring now to FIG. 20A, there is depicted a second embodiment of a test fixture for testing DUTs 14 using communication over a DDR memory bus, where the DUTs are manufactured onto circuit boards. As can be seen by comparison of FIG. 20A with FIG. 12A, the two test fixture embodiments are somewhat similar. However, in order to support use of DDR communication in the embodiment of FIG. 19A, there are a number of differences from the RSL embodiment illustrated in FIG. 12A. These differences include replacement of unpopulated Rambus connector 276 with unpopulated DDR connector 298, which may be a socket for a DDR memory module. Fundamental changes to system board 294 and peripheral board 296 that are not essential for an understanding of the present invention make them distinctly different from system board 252 and peripheral board 264 of FIG. 12A. FIG. 20B depicts a more detailed view of the connection of a controlled impedance test fixture 304 within DDR connector 298 of FIG. 20A.

The present invention is also applicable to testing logic devices using an alternative timing as shown in FIG. 21A. The illustrated signal timing differs from the Rambus Signaling Levels (RSL) transfers illustrated in FIG. 5A in that more than 2 data transfers are permitted per clock cycle, as with Quad RSL (QRSL) signaling. The present invention permits tester logic 50 or 50' to perform WRITE and READ transfers with DUT 14, for the purpose of testing the operation of DUT 14 with great emulation of the end use environment. FIG. 21A shows timing for a WRITE operation without any delay relative to the phase of the clock signal from DUT 14. FIG. 21B, by contrast, depicts testing the sensitivity of DUT 14 to variations in WRITE timing by applying a delay to CFM and CFMN equal to a full cycle minus $\Delta t_1$. By doing so, the setup time ($t_S$) is effectively decreased by $\Delta t_1$, and the timing sensitivity of DUT 14 can be evaluated.

Figure 22A:
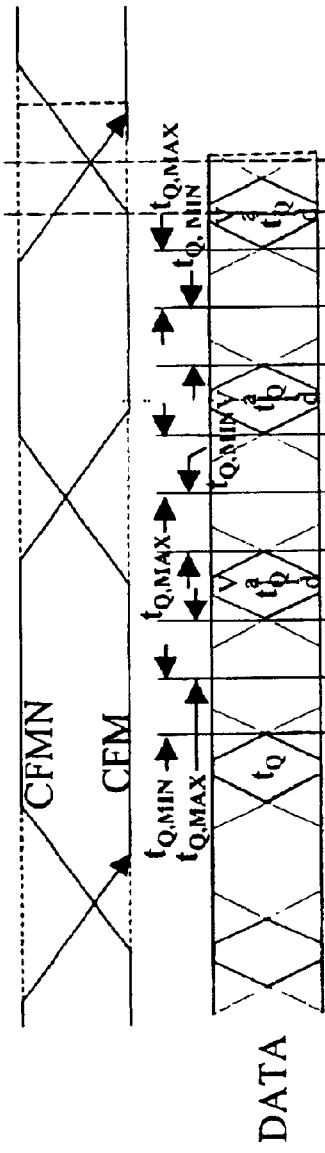
FIG. 22A is a timing diagram illustrating the timing of the clock-to-master (CTM) and clock-to-master negative (CTMN) for logic devices performing READ operations using a derivative of Rambus Signaling Levels with more than 2 transfers per clock, such as QSL.
Figure 22B:
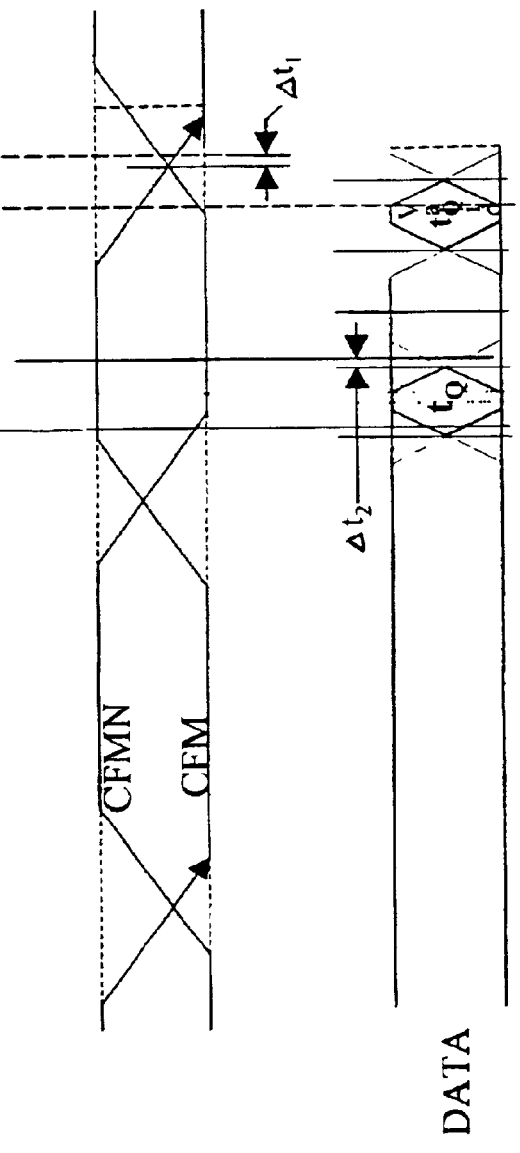
FIG. 22B is a timing diagram depicting the use of a programmable delay in the timing of the clock-to-master (CTM) and clock-to-master negative (CTMN) signals for logic devices performing READ operations using a derivative of Rambus Signaling Levels with more than 2 transfers per clock, such as QSL.

Referring now to FIGS. 22A–22B, timing diagrams showing DUT 14 using memory transfers more frequent than 2 per clock cycle are illustrated. With this signal timing, the timing sensitivity during READ operations is tested by stressing the $T_Q$ parameter through delays to the clock-from-master (CTM) and the complementary clock-from-master negative (CTMN) signals 132 output to DUT 14. FIG. 22A depicts signal timing without any applied delay. As shown in FIG. 22B, the sensitivity of DUT 14 to variations in READ timing can be tested by applying a delay to CTM and CTMN equal to a full cycle minus $\Delta t_2$ so that $t_Q$ is effectively decreased and the timing sensitivity of DUT 14 can be evaluated.

Figure 23A:
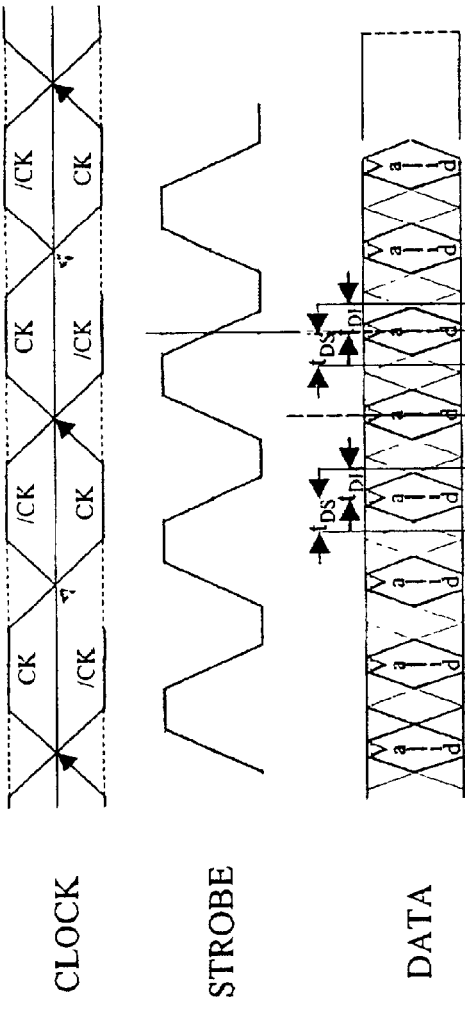
FIG. 23A is a timing diagram illustrating the timing of the clock and strobe (DQ) from logic devices performing WRITE operations using a derivative of DDR memory bus technology with more than 2 transfers per clock, such as QDR.
Figure 23B:
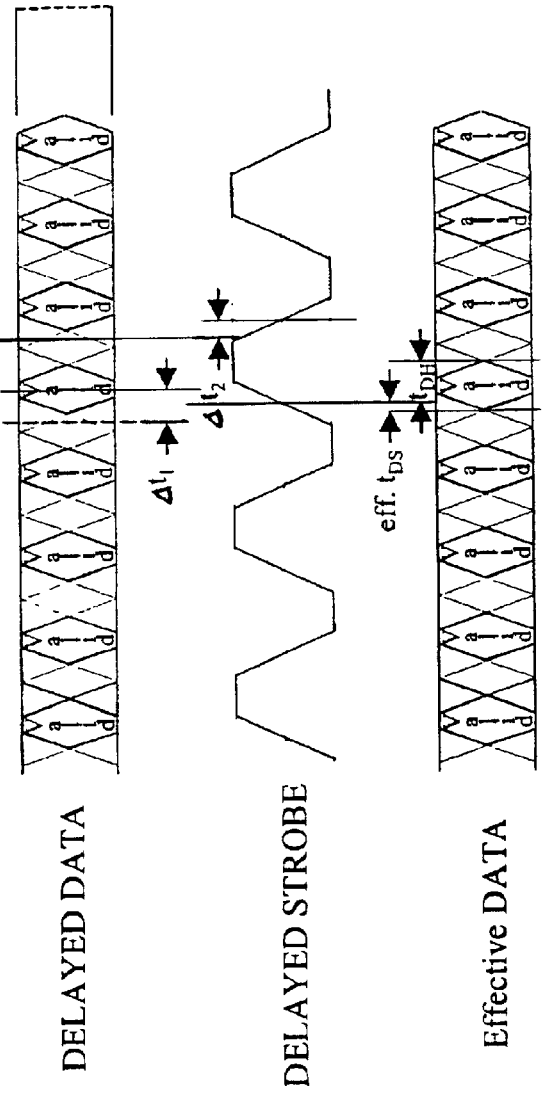
FIG. 23B is a timing diagram depicting the use of a programmable delay in the timing of the strobe (DQ) from logic devices performing WRITE operations using a derivative of DDR memory bus technology with more than 2 transfers per clock, such as QDR.

The present invention is also applicable to testing logic devices using an alternative memory technology timing as shown in FIG. 23A. The illustrated signal timing differs from the double data rate (DDR) synchronous signaling illustrated in FIG. 14A in that more than 2 data transfers per clock cycle are allowed, as in Quad Data Rate (QDR) memory technology. The present invention permits the tester logic 50 to perform WRITE and READ transfers with DUT 14, for the purpose of testing the operation of DUT 14 with great emulation of the end use environment. FIG. 23A shows timing for a WRITE operation without any delay to strobe (DQS). FIG. 23B, by contrast, depicts testing the sensitivity of DUT 14 to variations in WRITE timing by applying delays separately to data DQ_IN ($\Delta t_1$) and strobe DQS_IN ($\Delta t_2$) in such a manner that $\Delta t$_is greater than $\Delta t_2$. By doing so, the setup time ($t_{DS}$) is effectively decreased and the timing sensitivity of DUT 14 for the setup time ($t_{DS}$) can be evaluated. Similarly the required hold time ($t_{DS}$) for successful WRITE operations may be effectively forced longer by delaying strobe DQS_IN longer than data (DQ_IN).

Figure 24A:
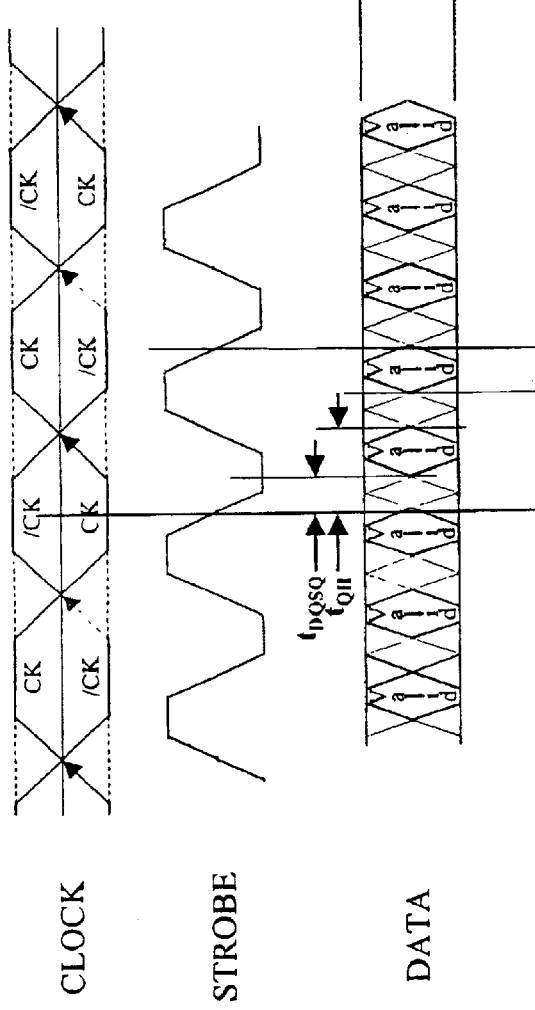
FIG. 24A is a timing diagram illustrating the timing of the clock and strobe (DQ) to logic devices performing READ operations using a derivative of DDR memory bus technology with more than 2 transfers per clock, such as QDR.
Figure 24B:
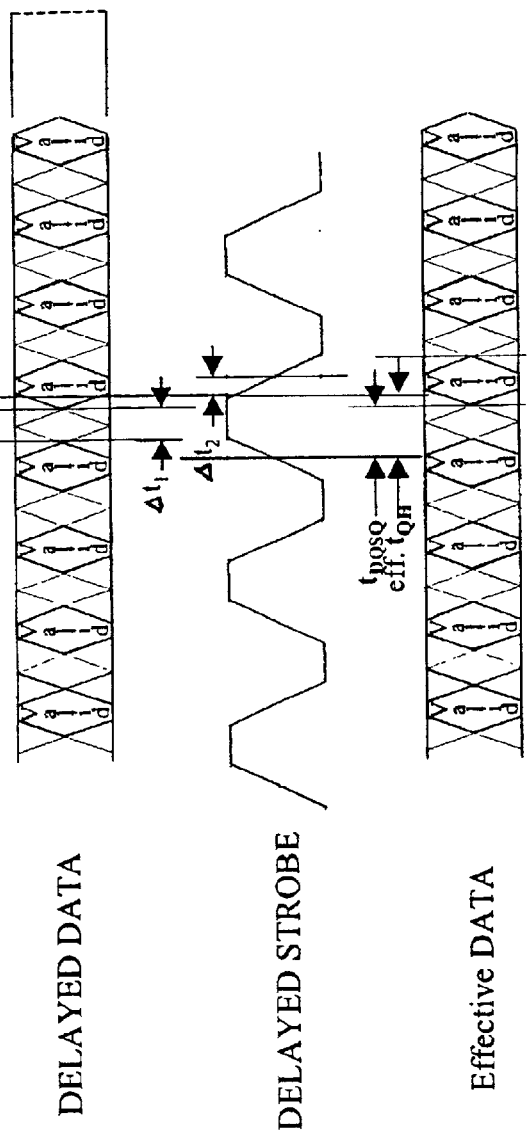
FIG. 24B is a timing diagram depicting the use of a programmable delay in the timing of the strobe (DQ) to logic devices performing READ operations using a derivative of DDR memory bus technology with more than 2 transfers per clock, such as QDR.

Referring now to FIGS. 24A–24B, timing diagrams showing DUT 14 using more than 2 memory transfers per clock cycle are depicted. The embodiment of the present invention shown in FIG. 13 can be employed to test the timing sensitivity of DUT 14 during READ operations by stressing the TDQSQ and TQH parameters through generation of delays separately to the DQ_OUT and DQS_OUT signals 244 output to DUT 14 by memory devices 232. FIG. 24A depicts signal timing without any applied delay. As shown in FIG. 24B, the sensitivity of DUT 14 to variations in READ timing can be tested by applying delays separately to data DQ_IN (Δt1) and strobe DQS_IN (Δt2) to narrow the window between the start of valid data output (TDQSQ) and the time at which DUT 14 expects completion of the READ operation. By narrowing the window in this manner, the timing sensitivity of DUT 14 for successful READ operations can be evaluated.

Figure 25:
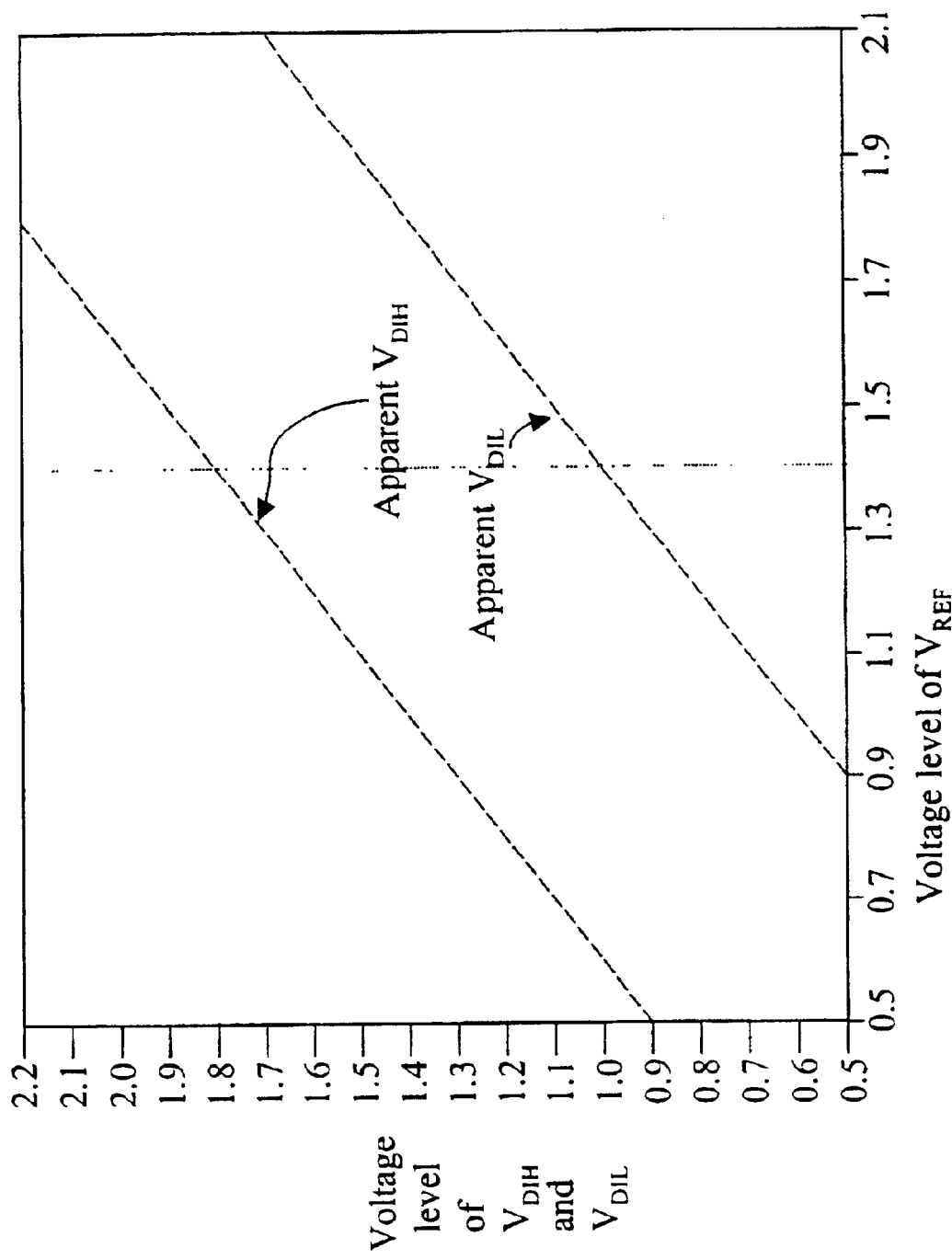
FIG. 25 is a voltage chart illustrating the effect varying $V_{REF}$ has on the apparent voltage levels of inputs to a DUT when using transfers of Rambus Signaling Levels (RSL) or its derivatives, such as QSL.

With reference now to FIG. 25, a voltage chart is given that illustrates the effect varying $V_{REF}$ has on the apparent voltage levels of inputs of a DUT 14 that uses Rambus Signaling Levels (RSL) transfers. The apparent input voltage for the high logic state ($V_{DIH}$) to DUT 14 for an actual voltage of 1.8 V varies linearly with a slope of 1.0 as $V_{REF}$ varies around 1.40 V. The apparent input voltage for the low logic state ($V_{DIL}$) to DUT 14 for actual voltage of 1.0 V varies linearly with a slope of 1.0 as $V_{REF}$ varies around 1.40 V. In this manner, the sensitivity of DUT 14 to a variation in input voltage from external devices employing RSL signaling can be tested.

Figure 26:
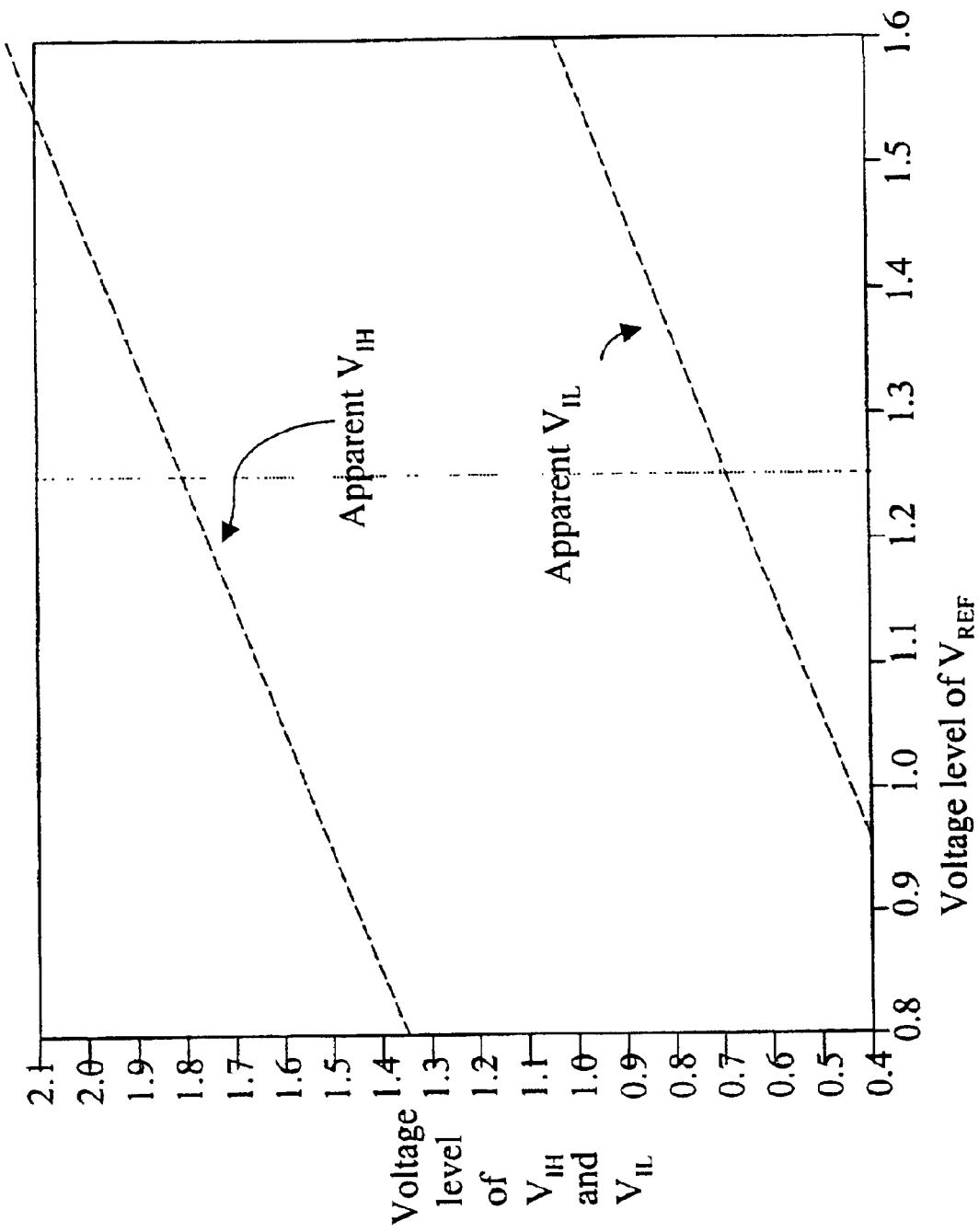
FIG. 26 is a voltage chart illustrating the effect varying $V_{REF}$ has on the apparent voltage levels of synchronous dynamic memory bus inputs to a DUT when transfers employ double data rate (DDR) or a DDR derivative, such as QDR.

FIG. 26 illustrates a voltage chart showing the effect varying $V_{REF}$ has on the apparent voltage levels of inputs of a DUT 14 that employs double data rate (DDR) synchronous dynamic memory bus transfers. The apparent input voltage for the high logic state ($V_{IH}$) to DUT 14 for actual voltage of 1.8 V varies linearly with a slope of 1.0 as $V_{REF}$ varies around 1.25 V. The apparent input voltage for the low logic state ($V_{IL}$) to DUT 14 for actual voltage of 0.7 V varies linearly with a slope of 1.0 as $V_{REF}$ varies around 1.25 V. Thus, by varying $V_{REF}$ in accordance with the present invention, the sensitivity of DUT 14 to a variation in input voltage from external devices using DDR or a derivative can be efficiently tested.

While the invention has been particularly shown and described with reference to a preferred embodiment, it will be understood by those skilled in the art that various changes in form and detail may be made therein without departing from the spirit and scope of the invention. For example, although aspects of the present invention have been described with respect to a tester system executing software that directs the functions of the present invention, it should be understood that the present invention may alternatively be implemented as a program product for use with a data processing system. Programs defining the functions of the present invention can be delivered to a data processing system via a variety of signal-bearing media, which include, without limitation, non-rewritable storage media (e.g., CD-ROM), rewritable storage media (e.g., a floppy diskette or hard disk drive), and communication media, is such as digital and analog networks. It should be understood, therefore, that such signal-bearing media, when carrying or encoding computer readable instructions that direct the functions of the present invention, represent alternative embodiments of the present invention.

What is claimed is:

1. A tester for testing dice on a wafer, said tester comprising:
a wafer probe card having connections for at least one die on a wafer, wherein the connections of the wafer probe card present an impedance selected to emulate the characteristic impedance of an end-use environment for a packaged device containing the at least one die; and
tester logic, coupled to the wafer probe card, that, responsive to receipt of a first command from the at least one die signifying a read access, supplies requested data to the at least one die via the wafer probe card, and responsive to receipt of a second command from the at least one die signifying a write access, stores associated data received from the at least one die in a memory.

2. The tester of claim 1, wherein the at least one die is a logic device using Rambus Signaling Levels (RSL) to communicate to other devices, the end-use environment is a Rambus channel, and the characteristic impedance is between 20 and 60 ohms.

3. The tester of claim 1, wherein the at least one die is a logic device using Rambus Signaling Levels (RSL) to communicate to other devices, the end-use environment is a Rambus memory module and the characteristic impedance is approximately 28 ohms.

4. The tester of claim 1, wherein the connections comprise microsprings, on at least one of the tester intersurface and the at least one die.

5. The tester of claim 1, said wafer probe card including a variable impedance network having a dynamically alterable impedance selected by the tester logic.

6. The tester of claim 1, wherein said wafer probe card includes at least one dummy packaged device to simulate operating characteristics of the end-use environment.

7. The tester of claim 1, wherein the tester logic includes a Rambus ASIC cell (RAC) that interfaces with the wafer probe card.

8. The tester of claim 1, wherein the tester logic further comprises:
a timing generator that generates at least one timing signal received by the tester logic and at least one corresponding timing signal received by the at least one die on the wafer, wherein the at least one timing signal coordinates data transfer between the tester logic and the at least one die; and
one or more delay elements that selectively alter the relative phases of the at lean one timing signal received by the at least one die and the at least one timing signal received by the tester logic in order to test timing sensitivity of the at least one die.

9. The tester of claim 8, wherein the one or mare delay elements delay die at least one timing signal sent to the at least one die relative to the corresponding at least one timing signal sent to the tester logic.

10. The tester of claim 9, wherein the at least one die comprises a logic device using Rambus Signaling Levels (RSL) to communicate to other devices, and wherein the at least one timing signal received by the RSL logic die comprises a clock-to-master positive polarity (CTM) clock signal and a clock-to-master negative polarity (CTMN) clock signal.

11. The tester of claim 10, wherein the RSL logic die outputs to the tester logic data signals and row and column signals while the one or more delay elements delay the clock-from-master positive polarity clock signal (CFM) and the clock-from-master negative polarity (CFMN) clack signal to the tester logic in order to test sensitivity of the RSL logic die to the clock-to-data timing parameter for reads by the RSL logic die.

12. The tester of claim 8, wherein the one or more delay elements delay the at least one timing signal sent to the tester logic relative to the corresponding at least one timing signal sent to the at least one die.

13. The tester of claim 12, wherein the at least one die comprises a RSL logic die, and wherein the at least one timing signal received from the RSL logic die comprises a clock-from-master positive polarity (CFM) clock signal and a clock-from-master negative polarity (CFMN) clock signal.

14. The tester of claim 13, wherein the RSL logic receives data signals from the tester logic while the one or more delay elements delay the clock-to-master (CTM) clock signal and the clock-to-master negative (CTMN) clock signal to the tester logic in order to test sensitivity of a setup and hold output timing parameter for writes by the RSL logic die.

15. The tester of claim 8, wherein the one or more delay elements shift the phase of the at least one timing signal received by the at least one die in small increments relative to the at least one timing signal received by the tester logic to vary the timing between reads by the at least one die and writes by the at least one die so test for worst case failures.

16. The tester of claim 15, wherein:
the at least one die comprises a RSL logic die;
the at least one timing signal received by the RSL logic die comprises a clock-to-master positive polarity (CTM) clock signal and a clock-to-master negative polarity (CTMN) clock signal; and
the at least one timing signal received by the tester logic comprises a clock-from-master positive polarity (CFM) clock signal and a clock-from-master negative polarity (CFMN) clock signal.

17. A tester for testing packaged integrated circuit devices, said tester comprising:
a test fixture having connections for at least one packaged integrated circuit device, wherein the connections of the test fixture present an impedance selected to emulate the characteristic impedance of an end-use environment for the at least one packaged integrated circuit device; and
tester logic, coupled to the test fixture, that receives test data transfers initiated by the at least one packaged device vie die test fixture.

18. The tester of claim 17, wherein the at least one packaged integrated circuit device is a logic device using a Rambus Signaling Levels (RSL) to communicate to other devices, the end-use environment is a Rambus channel, and the characteristic impedance is between 20 and 60 ohms.

19. The tester of claim 17, wherein the at least one packaged integrated circuit device is a RSL logic device, the end-use environment is a Rambus memory module, and the characteristic impedance is approximately 28 ohms.

20. The tester of claim 17, wherein the connections comprise microsprings.

21. The tester of claim 17, said test fixture including a variable impedance network having a dynamically alterable impedance selected by the tester logic.

22. The tester of claim 17, wherein said test fixture includes at least one dummy packaged integrated circuit device to simulate operating characteristics of the end-use environment.

23. The tester of claim 17, wherein the at least one packaged integrated circuit device comprises a packaged RSL logic device, and wherein the tester logic includes a Rambus ASIC cell (RAC) that interfaces with the seat fixture.

24. The tester of claim 17, wherein the tester logic further comprises:
a timing generator that generates at least one timing signal received by the tester logic and at least one corresponding timing signal reserved by the at least one packaged integrated circuit device, wherein the at least one timing signal coordinates data transfer between the tester logic and the at least one packaged integrated circuit device; and
one or more delay elements that selectively alter the relative phases of the at least one timing signal received by the at least one packaged integrated circuit device and the at least one timing signal received by the tester logic in order to rest timing sensitivity of the at least one packaged integrated circuit device.

25. The tester of claim 24, wherein the one or more delay elements delay the at least one timing signal sent to the at leant one packaged integrated circuit device relative to the corresponding at least one clock signal sent to the tester logic.

26. The tester of claim 25, wherein the at least one packaged integrated circuit device comprises a packaged RSL logic device, and wherein the at least one timing signal received by the packaged RSL logic device comprises a clock-to-master positive polarity (CTM) clock signal and a clock-to-master negative polarity (CTMN) clock signal.

27. The tester of claim 26, wherein the packaged RSL logic device outputs to the tester logic data signals and row and column signals while the one or more delay elements delay the clock-to-master positive polarity (CTM) clock signal and the clock-to-master negative polarity (CTMN) clock signal to the packaged RSL logic device in order to test sensitivity of the packaged RSL logic device to a clock-to-data output timing parameter for reads by the packaged RSL logic device.

28. The tester of claim 24, wherein the one or more delay elements delay the at least one timing signal sent to the tester logic relative to the corresponding at least one timing signal sent to the at least one packaged integrated circuit device.

29. The tester of claim 28, wherein the at least one packaged integrated circuit device comprises a packaged RSL logic device, and wherein the at least one timing signal received by the tester logic comprises a clock-from-master positive polarity (CFM) clock signal and a clock-from-master negative polarity (CFMN) clock signal.

30. The tester of claim 23, wherein the packaged RSL logic device receives data signals from the tester logic while the one or more delay elements delay the clock-from master (CFM) clock signal and the clock-from-master negative (CFMN) clock signal to the tester logic in order to test sensitivity of setup and hold timing parameters for writes by, the packaged RSL logic device.

31. The tester of claim 25, wherein the one or more delay elements shift the phase of the at least one timing signal received by the at least one packaged integrated circuit device in small increments relative to the at least one timing signal received by the tester logic to vary the timing between reads by the at least one packaged integrated circuit device and writes by the at least one packaged integrated circuit device to test for worst case failures.

32. The tester of claim 31, wherein:
the at least one packaged integrated circuit device comprises a packaged RSL logic device;
the at least one timing signal received by the packaged RSL logic device comprises a clock-to-master positive polarity (CTM) clock signal and a clock-to-master negative polarity (CTMN) clock signal; and
the at least one timing signal received by the tester logic comprises a clock-from-master positive polarity (CFM) clock signal and a clock-from-master negative polarity (CFM-N) clock signal.

33. A logic tester, comprising:
a connector having connections for a logic device under test (DUT) that is one of a packaged integrated circuit device and a logic die on a wafer, wherein the connections of the connector present an impedance selected to emulate the characteristic impedance of an end-use environment for the logic DUT; and tester logic, coupled to the apparatus, that communicates test data with the logic DUT, wherein said tester logic, responsive to receipt of a first command from the logic DUT signifying a read access, supplies requested data to the logic DUT via the wafer probe card, and responsive to receipt of a second command from the logic DUT signifying a write access, stores associated data received from the logic DUT in a memory.

34. The logic tester of claim 33, wherein the logic DUT is one of a packaged logic device and a RSL logic die using Rambus Signaling Levels (RSL) to communicate to other devices, and wherein the characteristic impedance is equivalent to that of a Rambus channel or a Rambus memory module.

35. A method of testing an integrated circuit device, said method comprising:
connecting a device under test that is one of a packaged integrated circuit device and logic die on a wafer to connections of a connector, wherein the connections present an impedance selected to emulate the characteristic impedance of an end-use environment for a packaged integrated circuit device including the device under test; and
coupling test logic in the connector; and
communicating test data transfers initiated by the device under test to the test logic via the connector to test the device under test, wherein said communicating includes:
in response to receiving a first command from the device under test signifying a read access, the test logic supplying requested test data to the device under test via the connector; and
In response to receiving a second command from the device under test signifying a write success, storing associated test data received from the at least one die in a memory.

36. The method of claim 35, wherein the end-use environment is a Rambus channel and the characteristics impedance is between 20 and 60 ohms.

37. The method of claim 35, wherein the end-use environment is a Rambus memory module and the characteristic impedance is approximately 28 ohms.

38. The method of claim 35, wherein said connector includes a variable impedance network, and wherein communicating test data between the device under test and the test logic comprises communicating test data with said variable impedance network set to multiple different impedances.

39. The method of claim 35, and further comprising interfacing the connector to the tester logic with a Rambus ASIC cell (RAC).

40. The method of claim 35, and further comprising:
generating at least one first timing signal received by the tester logic and at least one second timing signal received by the device under test, wherein the first and second timing signals coordinate data transfer between the tester logic and the device under test; and
selectively altering the phase of one of the first timing signal and the second timing signal to test timing sensitivity of the device under test.

41. The method of claim 40, wherein selectively altering comprises delaying the second timing signal sent to the device under test.

42. The method of claim 40, wherein the device under test uses Rambus Level (RSL) to communicate to other devices, and wherein generating at least one second timing signal comprises generating a clock-to-master (CTM) clock signal and a clock-to-master negative (CTMN) clock signal.

43. The method of claim 40, wherein the device under test receives data signals from the tester logic while the clock-to-master (CTM) clock signal and the clock-to-master negative (CTMN) clock signal are delayed to test sensitivity of a clock-to-data output timing parameter for reads.

44. The method of claim 40, wherein selectively altering comprises delaying the first timing signal sent to the tester logic.

45. The method of claim 43, wherein the at least one die uses Rambus Signaling Levels (RSL) to communicate to other devices, and wherein the first timing signal comprises a clock-from-master (CFM) clock signal and a clock-from-master negative polarity (CFMN) clock signal.

46. The method of claim 44, wherein the device under test outputs, to the tester logic, data signals and row and column signals while the clock-from-master (CFM) clock signal and the clock-from-master negative (CFMN) clock signal are delayed in order to test sensitivity of the device under test to the setup and hold timing parameters for writes.

47. The method of claim 40, wherein selectively altering comprises shifting the phase of the at least one second timing signal received by the device under test in increments relative to the at least one first timing signal received by the tester logic to vary the timing between reads from the device under test and writes to the device under test to test for worst case failures.

48. The tester of claim 18, wherein the at least one packaged RSL logic integrated circuit device is attached to a circuit board and the test fixture includes probes for contacting traces of said circuit board to permit the tester logic to communicate with the at least one packaged RSL integrated circuit device using Rambus Signaling Lewis (RSL) over a Rambus channel.

49. The tester of claim 18, wherein the at least one packaged RSL logic integrated circuit device is attached to a circuit board and the test fixture includes a connector fitting into a socket on said circuit board to permit the tester logic to communicate with the at least one packaged RSL logic integrated circuit device using Rambus Signaling Levels (RSL) over a Rambus channel.

50. The tester of claim 19, wherein the at least one packaged RSL logic integrated circuit device is attached to a circuit board and the test fixture includes probes for contacting traces of said circuit board to permit the tester logic to communicate with the at least one packaged RSL logic integrated circuit device using Rambus Signaling Levels (RSL) while the tester logic is emulating a Rambus memory module.

51. The tester of claim 19, wherein the at least one packaged RSL logic integrated circuit device is attached to a circuit board and the test fixture includes a connector fitting into a socket on said circuit board to permit the tester logic to communicate with the at least one packaged RSL logic integrated circuit device using Rambus Signaling Levels (RSL) while the tester logic is emulating Rambus memory module.

52. The tester of claim 1, wherein the at least one die comprises a logic device using a double data rate (DDR) synchronous dynamic memory bus to communicate to other devices.

53. The tester of claim 52, wherein the end-use environment is a DDR memory module and the characteristic impedance in approximately 60 ohms.

54. The tester of claim 1, wherein the tester logic includes one or more double data rate (DDR) synchronous dynamic memory devices that interface with the wafer probe card.

55. The tester of claim 8, wherein the at least one die comprises a DDR logic die using double data rate (DDR) synchronous dynamic memory bus to communicate to other devices, and wherein the at least one timing signal received by the DDR logic die comprises a data strobe (DQS) timing signal and the at least one corresponding timing signal received by the tester logic comprises a data strobe (DQS) timing signal.

56. The tester of claim 55, and further comprising one or more delay elements that alter the relative timing of the DQS timing signal sear to the tester logic and the DQS timing signal sent to the DDR logic die.

57. The tester of claim 56, wherein the DDR logic die outputs, to the tester logic, data signals while the one as more delay elements delay the data strobe (DQS) timing signal to the tester logic in order to test sensitivity of the DDR logic die to the clock-to-data timing parameter for reads by the DDR logic die.

58. The tester of claim 56, wherein the DDR logic receives data signals from the tester logic while she one or mare delay elements delay data strobe (DQS) timing signal to the tester logic in order to test sensitivity of a setup and hold output timing parameter for writes by the DDR logic die.

59. The tester of claim 58, wherein the one or more delay elements shift the phase of the DQS timing signal received by the DDR logic die in small increments relative to the DQS timing signal received by the tester logic to vary the timing between reads by the DDR logic die and writes by the DDR logic die to test for worst case failures.

60. The tester of claim 1, wherein the tester logic includes at least one double data rate (DDR) synchronous dynamic memory module that interfaces with the wafer probe card.

61. The tester of claim 17, wherein the at least one packaged integrated circuit device comprises a DDR logic device that uses a double data rate (DDR) synchronous dynamic memory bus to communicate to other devices, the end-use environment is a DDR memory module; and the characteristic impedance is approximately 60 ohms.

62. The tester of claim 17, wherein the at least one packaged integrated circuit device comprises a packaged DDR logic device, and wherein the tester logic includes one or more double data rate (DDR) synchronous dynamic memory devices that interface with the test fixture.

63. The tester of claim 24, wherein the at least one packaged integrated circuit device comprises a packaged DDR logic device, and wherein the at least one timing signal received by the packaged DDR logic device comprises a data strobe (DDS) timing signal and wherein the at least one corresponding timing signal received by the tester logic comprises a data strobe (DQS) timing signal.

64. The tester of claim 63, wherein the packaged DDR logic device outputs to the tester logic data signals while the one or more delay elements delay the data strobe (DQS) timing signal to the packaged DDR logic device in order to test sensitivity of the packaged DDR logic device torn clock-to-data output timing parameter for reads by the packaged RSL logic device.

65. The tester of claim 63, wherein the packaged DDR logic device receives data signals limit the tester logic while the one or more delay elements delay the data strobe (DQS) timing signal to the tester logic to test setup and bold timing parameters for writes by the packaged DDR logic device.

66. The tester of claim 63, wherein the one or more delay elements shift the phase of the DQS timing signal received by the at least one packaged integrated circuit device in small increments relative to the DQS timing signal received by the tester logic to vary the timing between reads by the at least one packaged integrated circuit device and writes by the at least one packaged integrated circuit device to test for worst case failures.

67. The method of claim 35, wherein the at least one die comprises a DDR logic device that employs a double data rate (DDR) synchronous dynamic memory bus to communicate to other devices, the end-use environment is a DDR memory module, and the characteristic impedance is approximately 60 ohms.

68. The method of claim 35, and further comprising interfacing the connector to the tester logic with one or more data rate (DDR) synchronous dynamic memory devices.

69. The method of claim 40, wherein the device under test uses a double data rate (DDR) synchronous dynamic memory bus to communicate to other devices, and wherein generating at least one first and at least one second timing signal comprises generating at least a first data strobe (DQS) timing signal and at least a second data strobe (DQS) timing signal.

70. The method of claim 69, wherein the device under test receives data signals from the tester logic while the second data strobe (DQS) timing signal to the device under test is delayed to test sensitivity of a clock-to-data output timing parameter for reads.

71. The method of claim 69, wherein the device under test outputs, to the tester logic, data signals and row and column signals while the first data strobe (DQS) timing signal to the tester logic is delayed in order to test sensitivity of the device under test to the setup and hold timing parameters for writes.

72. The tester of claim 61, wherein the at least one packaged DDR logic integrated circuit device is attached to a circuit board and the test fixture includes probes for contacting traces of said circuit board to permit the tester logic to communicate with the at least one packaged DDR logic integrated circuit device using a DDR synchronous dynamic memory bus.

73. The tester of claim 61, wherein the as least one packaged DDR logic integrated circuit device is attached to a circuit board and the test fixture includes probes for contacting traces of said circuit board to permit the tester logic to communicate with the at least one packaged logic integrated circuit device using a double data rate synchronous dynamic (DDR) memory bus while the tester logic is emulating a DDR memory module.

74. The tester of claim 61, wherein the at least one packaged DDR logic integrated circuit device is attached so a circuit board and the test fixture includes a connector fitting into a socket on said circuit board to permit the tester logic to communicate with the at least one packaged logic integrated circuit device using double data rate (DDR) synchronous dynamic memory bus while the tester logic is emulating DDR memory module.

* * * * *